United States Patent [19]

Ohnishi

[11] 4,202,091
[45] May 13, 1980

[54] METHOD OF MANUFACTURING A HYBRID FRAMEWORK CONSISTING OF METALLIC PLATE AND PROJECTION MADE OF SYNTHETIC RESIN

[75] Inventor: Masanori Ohnishi, Katano, Japan

[73] Assignee: Matsushita Electric Industrial Co. Ltd., Kodama, Japan

[21] Appl. No.: 855,907

[22] Filed: Nov. 29, 1977

Related U.S. Application Data

[62] Division of Ser. No. 664,037, Mar. 4, 1976, Pat. No. 4,075,395.

[51] Int. Cl.² .................. B22D 11/126; B32B 9/04
[52] U.S. Cl. ........................ 29/527.1; 29/530; 29/858; 428/542; 428/131; 264/331; 264/328; 264/273; 264/279; 249/95; 425/129 R
[58] Field of Search .............. 29/530, 527.4, 527.1, 29/628; 248/19, 23; 428/131, 137, 138, 139, 140, 542; 360/137, 96, 60; 264/328, 331, 273, 274, 279, 219; 235/61.11 D; 425/127, 129 R; 249/95

[56] References Cited

U.S. PATENT DOCUMENTS

| 2,566,636 | 9/1951 | Renholts ................... 425/117 X |
|---|---|---|
| 2,864,156 | 12/1958 | Cardy ........................ 29/530 X |
| 3,308,225 | 3/1967 | Wells ........................ 264/273 |
| 3,354,260 | 11/1967 | Brandt et al. ............... 29/628 X |
| 3,437,529 | 4/1969 | Honer ...................... 264/273 X |
| 3,469,016 | 9/1969 | Shelton ..................... 29/530 |
| 3,474,185 | 10/1969 | Ahearn, Jr. et al. ......... 264/272 X |
| 3,484,935 | 12/1969 | Burns ....................... 29/628 |
| 3,779,506 | 12/1973 | Adams ...................... 249/95 |
| 4,014,090 | 3/1977 | Rusk et al. ................. 264/273 |
| 4,050,756 | 9/1977 | Moore ....................... 29/628 |

FOREIGN PATENT DOCUMENTS 266366 10/1963 Australia .................. 264/273

Primary Examiner—Francis S. Husar
Assistant Examiner—V. K. Rising
Attorney, Agent, or Firm—Wenderoth, Lind & Ponack

[57] ABSTRACT

When constructing an electrical or electronic device or mechanical device such as a tape recorder, the framework therefor must be provided with various projections for installing various components to be contained therein, or something such as a spring for actuating the mechanism incorporated thereon must be previously provided on the framework. The present disclosure relates to such projections which are made of synthetic resin which can be integrally formed on a metallic plate during the step of molding and also to such molded projections which are not deformed by the shrinking of the synthetic resin when molded integrally with the plate to form the framework.

1 Claim, 85 Drawing Figures

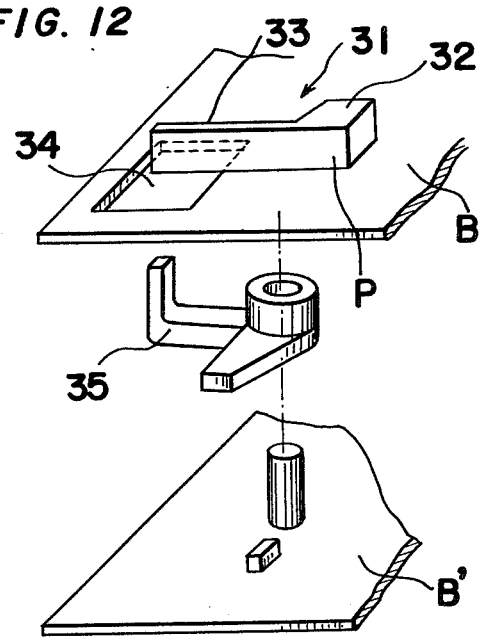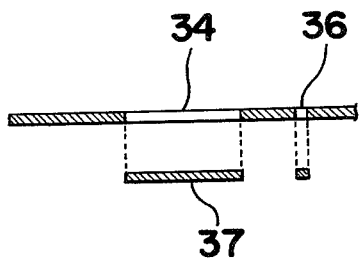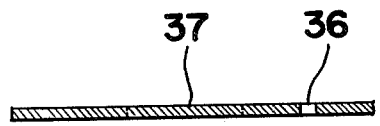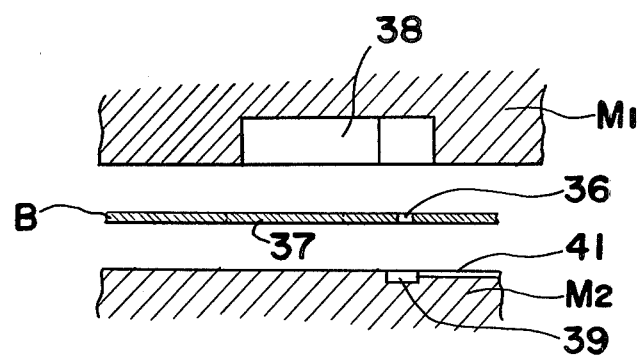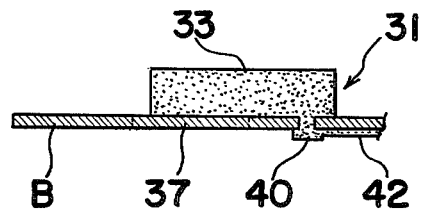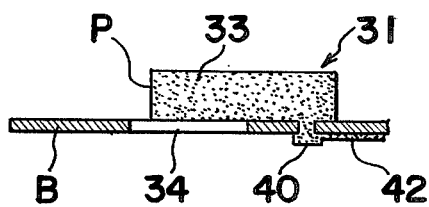

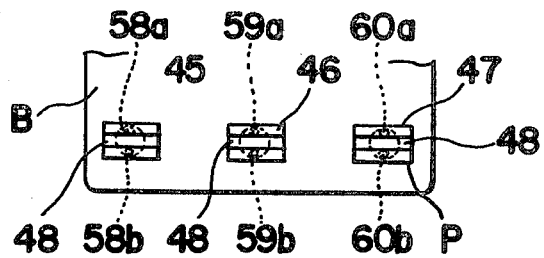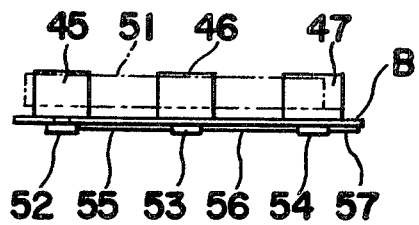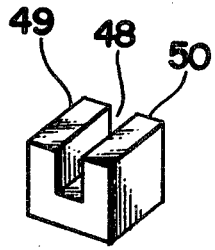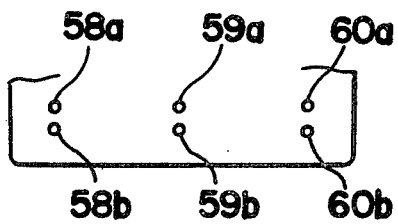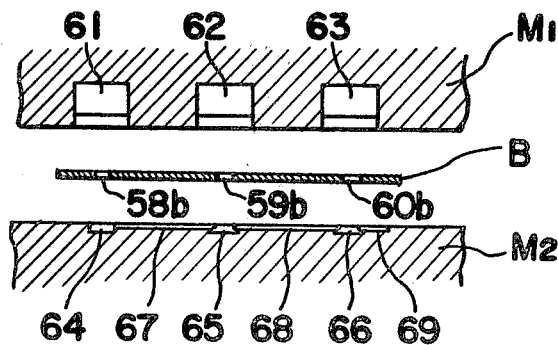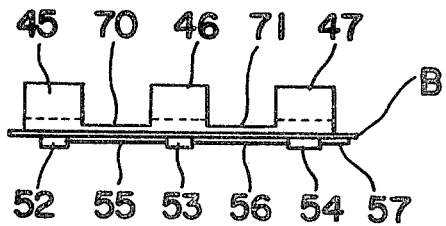

METHOD OF MANUFACTURING A HYBRID FRAMEWORK CONSISTING OF METALLIC PLATE AND PROJECTION MADE OF SYNTHETIC RESIN

BACKGROUND OF THE INVENTION

This application is a divisional application of application Ser. No. 664,037 filed Mar. 4, 1976, now U.S. Pat. No. 4,075,395, issued Feb. 21, 1978 and identically entitled.

The present invention relates to a method of manufacturing a hybrid framework consisting of a metallic plate and one or more projections secured thereto for use in an electrical or electronic device such as a tape recorder, more particularly, to a method of manufacturing a framework mainly consisting of a metallic plate and projections made of synthetic resin material rigidly secured to the metallic plate by injecting molding.

In constructing an electrical or electronic device such as a tape recorder or the like, various components incorporated therein, for example a printed circuit plate, a transformer, a motor and a speaker if any, etc., are normally spaced from a chassis or a framework therefor, by projections fixedly mounted on the surface of the framework. Additionally, the framework of such a device as described above is further provided with other projections for use in actuating various mechanism incorporated therein. Such latter projections include, for example, a leaf spring, which is employed in association with a rotary switch unit, wherein one end portion of the leaf spring is secured to the framework and the other end portion thereof urges a cam plate of the rotary switch unit by the effect of its own elastic force so that the cam plate can be held in any one of several operating positions, or another projection for a mechanism which may be a guide for reciprocatingly supporting a movable member, or a case for receiving part of a mechanism therein.

Moreover, if the framework of such device consists of several layers, it is necessary to form suitable openings in the framework so that the mechanism provided on one layer may be operated from the other layer by arm means mechanically connecting mechanisms provided on the two layers through the openings, or in order that one of the components provided on the lower layer may be more firmly supported by fixedly securing the head portion of the component into the opening formed in the upper layer. For the former purpose the opening may be provided with another arm means extending across the opening for sensing the movement of the first arm means. On the other hand, for the latter purpose the opening must be formed with accuracy for exactly receiving the head portion therein.

Such projections and openings as described above are preliminarily formed on the framework before assembling the various components and mechanism thereon. Conventionally, these projections are formed by methods as described hereinbelow.

According to one conventional method, the above described projections, usually made of synthetic resin such as thermoplastic, are preliminarily molded into preferable configurations in an independent process before being mounted on the framework of an electrical device. During assembling, each of the projections is placed on the framework at a predetermined position, and then fixedly mounted thereon one by one, by suitable securing means such as securing screws, or by insertion thereof into an opening formed in the framework, so that the projections will securely hold various components or actuate the mechanism to be incorporated in the device.

On the other hand, according to another conventional method which is used in the case where the framework is made of synthetic resin, these projections may be integrally formed on the framework while molding the latter.

However, the above described conventional methods hitherto employed to form projections on the framework have numerous disadvantages as described hereinbelow.

In the former method, it is necessary to keep a number of pieces for those projections in order before mounting them on the framework, and also those projections are prepared in one independent process, while mounting them fixedly on the framework is effected in another process. These two processes not only require extra constructing steps, but also result in an increase in the manufacturing cost of the device, as compared with a process which combines these two processes in one step.

In the latter method, although the above described two processes, i.e., the process for constructing the projections and the process for mounting them on the framework are effected in one step, the projections may not be formed at the predetermined positions with accuracy, due to the fact that the distortion of the synthetic resin may deform the projections undesirably, or that uneven shrinkage of the synthetic resin may direct the projections in indefinite directions. Furthermore, a framework made of synthetic resin is not suitable for the devices of large size, especially when the framework is made of thin-gauge material because the lack of stiffness of the synthetic resin may result in failure of the framework to support the components to be mounted thereon, and also the larger the mass of the synthetic resin becomes, the greater will be the distortion, due to shrinkage.

Therefore, it is a primary object of the present invention to improve the process of constructing an electrical device or mechanical device by molding synthetic resin parts directly on a metallic framework therefor, and to provide synthetic resin parts fixedly mounted on a metallic framework by an improved constructing process.

Another object of the present invention is to provide a plurality of synthetic resin parts in one molding process by providing runners between the synthetic resin parts.

A further object of the present invention is to provide suitable correcting means for the synthetic resin parts for correcting distortion of the synthetic resin parts arranged on the framework.

According to the present invention, the foregoing objects and others are accomplished by molding the synthetic resin directly on the framework in a manner as described hereinbelow.

Before molding the synthetic resin parts on the framework, the metallic framework must have openings formed at predetermined positions for forming the synthetic resin parts around said openings. Then each of these openings is completely surrounded by walls of a cavity formed by two molding blocks holding the framework therebetween. One of the blocks, which faces the upper surface of the framework, where the part must be formed, has a recess having the shape of the part to be molded, and the other block which faces the lower surface, also has a shallow recess at a position corresponding to the first recess formed in the one block.

When these two blocks tightly hold the framework, therebetween, the recess formed in the upper block and the corresponding recess formed in the lower block form a cavity, the two recesses being connected through the opening formed in the framework.

The cavity formed by the two blocks is filled with plasticized synthetic resin by any known means such as by a plastic injection-molding machine. When the material in cavity is hardened by the cooling and the mold block is opened, the part ejected therefrom is fixedly secured to the metallic framework. In other words, the ejected part is tightly engaged with the edge of the opening formed in the metallic framework because of the fact that a lump of synthetic resin formed immediately under the framework by the shallow recess tightly engages with the edge defining the opening as in riveting, due to shrinkage of the synthetic resin forming the part.

Although, it is possible to mount a projection in one or two circular openings formed in the framework, especially when they are small in size, large size projections, such as a case, may not be held on the framework sufficiently in one or two openings. However, on the other hand, if such a large projection were to be held on the framework in several openings, the shrinkage of the synthetic resin might cause the projection to be distorted to an undesirable extent, since the shrinkage normally proceeds towards the center portion of the product.

According to the present invention, such a large projection is mounted in an opening having a number of grooves formed in the framework extending radially outwardly from the center portion of the opening, so that the bottom portion of the product will shrink towards the center portion thereof in relation to the other portions thereof, and as a result, the whole product will shrink evenly.

Therefore, the parts fixedly formed on the framework in openings can be readily used as projections for holding the various components to be incorporated in the device or for an actuating mechanism incorporated therein, or for other purposes.

Although the projections in the foregoing description are described as being formed individually one by one, it is possible, according to the present invention, to form a plurality of synthetic resin parts, i.e., projections, on the framework in one molding operation by connecting the cavities for the products with channels, or grooves for forming runners. Each cavity serves as the mold for a single part, e.g. a spacer projection or a guiding projection, a leaf spring, etc. Although the small parts themselves may not shrink to such a degree as to distort the original configuration thereof, the shrinkage of the runners connecting the parts may undesirably cause the items to incline or rotate. Therefore, according to the present invention, these runners are provided with further auxiliary runners for forcibly preventing the runners from such undesirable distortions, or the runners can be molded in such a form that the shrinking force of the runners will not cause the parts to be distorted.

Since the runners are provided only for connecting the parts, these runners may be removed after being ejected from the mold. However, the operation for removing the runners may be unnecessary if the runners do not interfere with the component or mechanism to be incorporated in the device. For those runners which interfere with the component or mechanism, they may be formed in such a manner as to detour around the position of the component or mechanism.

These and other objects and features of the present invention will become apparent from the following description taken in conjunction with preferred embodiments thereof with reference to the accompanying drawings, in which:

FIG. 12 is a fragmentary exploded perspective view of the framework F, showing a part of a mechanism coupled with a leaf spring;

FIGS. 13 and 14 are fragmentary cross sectional views of the base plate, showing the openings to be formed in the base plate for forming the leaf spring together with the cut out pieces;

FIG. 15 is a fragmentary cross sectional view of the base plate for forming the leaf spring, and showing the relation between the upper and lower molding blocks;

FIG. 16 is a fragmentary side sectional view of the ejected leaf spring;

FIG. 17 is a similar view to FIG. 16, but particularly shows the ejected leaf spring after the cut out piece is removed;

FIGS. 18 and 19 are fragmentary top and front views of a series of guiding blocks;

FIG. 20 is a perspective view of one of the series of guiding blocks;

FIG. 21 is a fragmentary top plan view of the base plate for forming thereon a series of guiding blocks, shown in FIGS. 18 and 19;

FIG. 22 is a fragmentary side sectional view showing the relation between the base plate and the upper and lower molding blocks, for forming the series of guiding blocks;

FIG. 23 is a similar view to FIG. 19, but particularly shows a modification thereof;

Referring to FIGS. 1 to 4, there is shown a completed piece of a framework F for use in a device, for example, a tape recorder, which comprises a metallic base plate B and a plurality of synthetic resin parts which are generally called projections P, and fixedly mounted on the base plate B for holding components (not shown) to be incorporated in the device or for actuating the mechanism incorporated in the device. These projections P made of synthetic resin such as polyacetal, are formed by a process of injection molding which forms a plurality of projections at one time, so that one molding process will produce a plurality of projections P fixedly formed on the base plate B.

Figure 3:
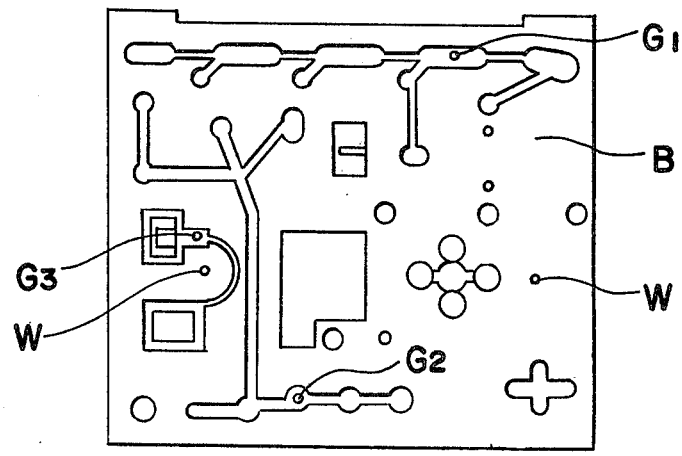
FIG. 3 is a bottom view of the framework F shown in FIG. 1.
Figure 4:
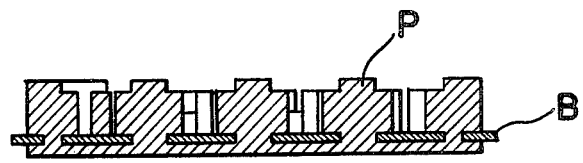
FIG. 4 is a cross sectional view taken along the line IV—IV of FIG. 2.
Figure 5:
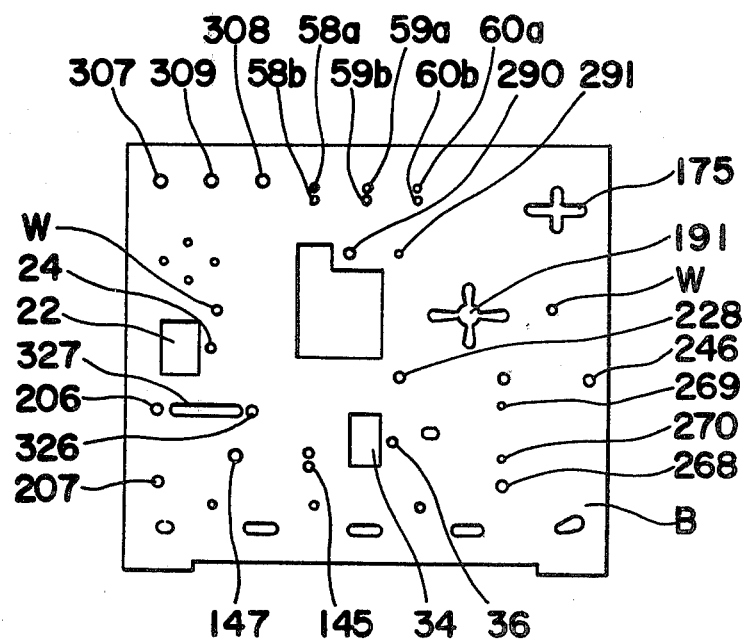
FIG. 5 is a top plan view of the base plate B.
Figure 6:
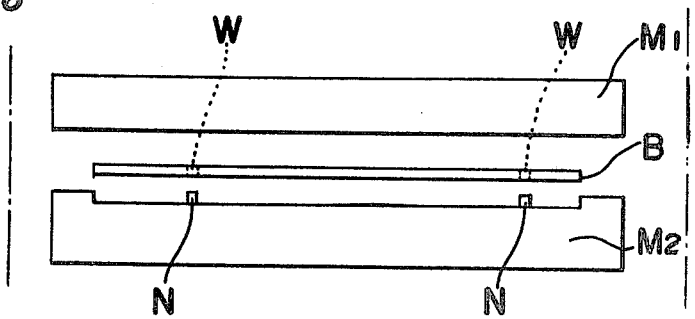
FIG. 6 is a schematic side view of the base plate B together with the upper and lower molding blocks $M_1$ and $M_2$.

In order to form such projections P on the base plate B, the base plate B is preliminarily provided with openings at the positions where the projections P are to be formed as shown in FIG. 5. A detailed description of each of the openings is provided later in connection with the description of each of the projections P. The base plate B with the openings is then held between upper and lower molding blocks $M_1$ and $M_2$. For the purpose of convenience, the pair of upper and lower molding blocks $M_1$ and $M_2$ may be divided into several pairs. The upper molding block $M_1$ is provided with recesses each of which corresponds with the configuration of each projection P. On the other hand, the lower molding block is provided with shallow recesses at positions corresponding to the recesses formed in the upper molding block for forming a mass of synthetic resin thereat. When the upper and lower molding blocks $M_1$ and $M_2$ tightly hold the base plate B therebetween, each of the recesses formed in the upper molding block $M_1$ and corresponding recesses formed in the lower molding block $M_2$ define a cavity extending through the opening formed in the base plate B. The positioning of the base plate B between the molding blocks $M_1$ and $M_2$ is achieved by at least two pins N integrally formed on the lower molding block $M_2$, each of the pins N being introduced into a corresponding opening W, formed in the base plate B, as most clearly seen in FIG. 6. Normally on the lower molding block, the shallow recesses are connected to each other by grooves, which form, runners when the base plate B is held between the molding blocks. The molten synthetic resin is injected into the cavities from at least one cavity gate. In this case, these cavity gates (not shown) are formed in the lower molding block $M_2$. The reference characters $G_1$, $G_2$ and $G_3$ in FIG. 3 show the positions from which the molten synthetic resin is injected.

Therefore, as a result, each projection P has an extension portion inserted into the opening which is formed in the base plate B, and a mass of synthetic resin integrally formed with the extending portion immediately below the plate B in such a manner as to cover up the above mentioned opening.

It should be noted that the recess formed in the lower molding block $M_1$ can be provided with a projection for the purpose of the present invention, which will be described in detail in connection with FIGS. 7 to 11.

According to the present invention, the projections are formed by a process of molding by the following four steps:

the first step is mating the upper molding block $M_1$ with the upper mating surface of the base plate B, and the lower molding block $M_2$ with the lower mating surface of the base plate B, thus forming cavities between the two molding blocks;

the second step is injecting molten synthetic resin into the cavities from the cavity gate by any known injection machine;

the third step is cooling the molding blocks and further injecting synthetic resin to solidify the resin; and the fourth step is ejecting from the mold the synthetic resin parts formed by the molding and which parts are engaged with the base plate B.

After having completed these molding steps, each of the projections P formed by the mold is fixedly mounted on the base plate B because each projection formed on the upper surface of the base plate B and the integrally formed mass of synthetic resin on the lower surface of the base plate B tightly engages the edge of the opening due to the effect of shrinkage of the synthetic resin in the opening.

Therefore, projections ejected from the mold can be readily used as projections for holding various components or for effecting on the mechanism to be mounted on the base.

Figure 1:
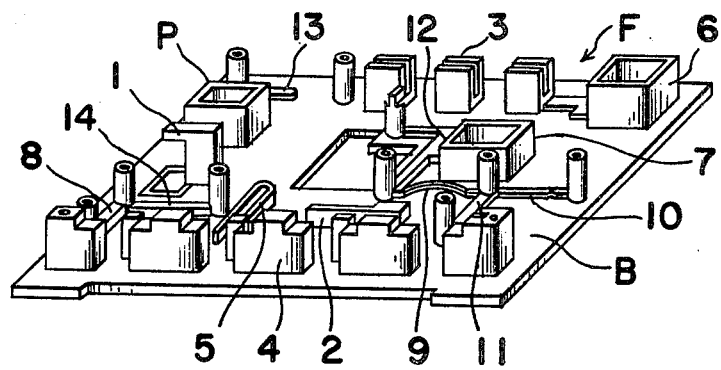
FIG. 1 is a perspective view of a completed framework F.
Figure 2:
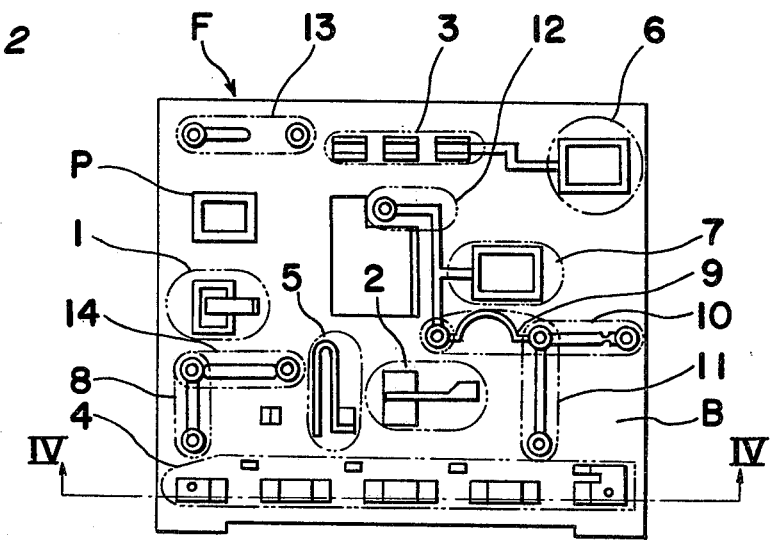
FIG. 2 is a top plan view of the framework F shown in FIG. 1.

Referring particularly to FIG. 2, each of the items 1 through 14 encircled by a chain line constitutes a unit of the framework F, the numerals 1 through 7 designating individual projections P, and the numerals 8 through 14 designating various runner means which connect two individual projections.

The detailed description of each of the items 1 through 14 is given individually hereinafter in connection with the attached drawings.

ITEM 1

Figure 7:
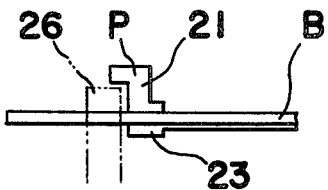
FIGS. 7 and 8 are fragmentary front and top views of an inverted L-shaped projection.
Figure 8:
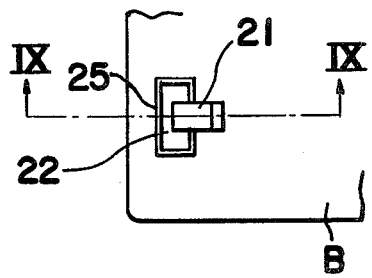
Figure 9:
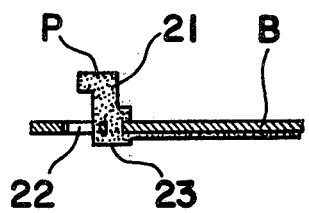
FIG. 9 is a cross sectional view taken along the line IX—IX of FIG. 8.

Referring to FIGS. 7 to 9, there is shown a completed piece of the molded projection P, namely an inverted L-shaped projection 21 mounted on the base plate B, and an opening 22 is formed immediately next to the L-shaped projection 21. The L-shaped projection 21, extending upwardly at right angles from the base plate B, is bent at the upper portion thereof to cover part of the opening 22. Positioned under the base plate B is a mass 23 of synthetic resin, integrally formed with the inverted L-shaped projection 21 through a small opening 24 formed in the base plate B. Since the area of the mass 23 is greater than the cross-section of the small opening 24, the L-shaped projection 21 is fixedly secured to the baseplate B. The peripheral edge of the opening 22 is provided with a frame 25 which is also formed by molding.

The opening 22 is adapted to receive therein, for instance, a head portion 26 of one of the components as shown by a chain line in FIG. 7 and positioned below the base plate B, while the L-shaped projection 21 is adapted to engage said head portion 26 inserted into the opening 22 at the upper bent over portion.

Figure 10:
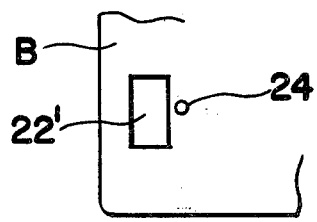
FIG. 10 is a fragmentary top plan view of the base plate before forming the inverted L-shaped projection thereon.
Figure 11:
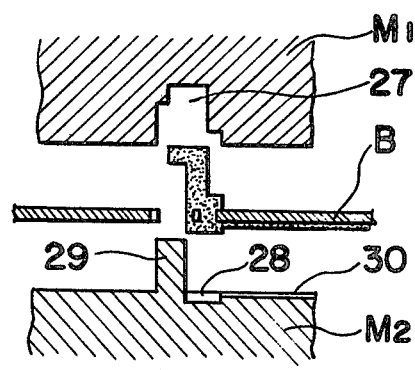
FIG. 11 is a fragmentary cross sectional view showing the relation between the base plate and the upper and lower molding blocks for forming the inverted L-shaped projection.

In order to form such an L-shaped projection 21 together with the frame 25 for the opening 22, the metallic base plate B first has openings 22' and 24 formed therein, as most clearly seen in FIG. 10. It should be noted that the opening 22' is larger than the opening 24. Then, the base plate B is tightly held between upper and lower molding block $M_1$ and $M_2$, as shown in FIG. 11. The upper molding block $M_1$ has a recess 27 which corresponds to the configuration of the inverted L-shaped projection 21 engaging the above described head portion 26. On the other hand, the lower molding block $M_2$ has a shallow recess 28 which corresponds with the mass 23, and also has a projection 29 extending upwardly from a position immediately next to the shallow recess 28. The projection 29 has a size exactly the same as that of the above described head portion 26. The shallow recess 28 is connected by a groove 30 extending towards one of the neighboring shallow recess (not shown). When these two molding blocks $M_1$ and $M_2$ tightly hold the base plate B therebetween in the proper position, the cavity formed by the recesses 27 and 28 has exactly the same configuration as the L-shaped projection 21 together with the mass 23.

It should be noted that the projection 29 should not contact any portion of the edges of the opening 26, but should loosely pass through the opening 26, thereby forming a cavity between the edge of the opening 26 and the surface of the projection 29.

When the molten synthetic resin is injected into the cavity by any known injection means from a cavity gate (not shown), the molten synthetic resin fills up the cavity. Subsequently, the molding blocks $M_1$ and $M_2$ are cooled by a suitable cooling means (not shown) to solidify the synthetic resin injected therein. Soon after the synthetic resin solidifies, the mold is opened and the finished projection 21 is ejected with the mass 23 fixedly holding the projection in the opening 24 of the base plate B as in riveting, as best shown in FIG. 9.

Since parts of the cavity existed around the edge of the opening 26, the opening 22' is provided with the synthetic resin frame 25 when the base plate is ejected from the mold, thus forming the smaller opening 22, which must be formed with an accuracy so as to receive the above described head portion 26 therein.

Although it is possible to obtain the opening 22 without forming any frame therearound, by preliminarily forming the opening 22' in the metallic plate B, the projection 29 must fit exactly in the opening 22' for preventing any molten synthetic resin from flowing between the opening 22' and the projection 29, in which case the size of the projection 29 must be finished with accuracy, as well as the opening 22'.

In other words, in order to prevent the synthetic resin from flowing therethrough, the size of the projection 29 on the molding block $M_2$ must be formed with accuracy as well as the opening 22', and in such case the insertion of the projection 29 can be carried out only with much difficulty.

On the other hand, according to the present invention, the opening 22 can be formed precisely in the predetermined size by the frame 25 during the step of molding, at the position around the edge of the previously prepared opening 22' in the metallic base plate B. In this case, the opening 22 is required to be at least large enough for enabling the projection 29 to pass therethrough, and furthermore the positioning of the opening 22 exactly in the predetermined position can be easily effected by the proper positioning of the base plate B between the molding blocks $M_1$ and $M_2$, which can be ensured without difficulty.

Therefore, according to the present invention, the supporting projection 21 can readily be provided on the metallic base plate B by the molding process, and the opening 22 for receiving the head portion can also be formed with accuracy during the same molding process.

ITEM 2

Referring to FIG. 12, there is shown a completed molded projection P, namely a leaf spring 31 mounted on the metallic base plate B at one end portion 32 thereof, while the other end portion 33 thereof is extended across part of a rectangular opening 34 formed in the base plate B. The end portion 33 partly crosses the opening 34 which is provided for receiving an arm means 35 extending from another base plate B' positioned below the base plate B in parallel relation thereto. The arm means 35 is normally urged in one direction so that the arm means 35 can be maintained in one operating position, and in which position it will actuate one of the mechanism contained in the apparatus. Since the present invention is not directed to the mechanism, a detailed description of the operation of the arm means 35 with the leaf spring 31 is omitted.

In order to form such a leaf spring 31 on the base plate B, with one end portion 33 partly crossing the opening 34, the base plate B first has openings 34 and 36 formed therein as most clearly seen in FIG. 13. At least the opening 34 is formed by a process of blanking, so that a blanked out piece 37 will temporarily fill in the opening 34, as shown in FIG. 14. Then, the base plate B with the blanked out piece temporarily held in the opening 34 is tightly held between the upper and lower molding blocks $M_1$ and $M_2$.

Referring now to FIG. 15, the upper molding block $M_1$ has a recess 38 which corresponds exactly to the configuration of the leaf spring 31, while the lower molding block $M_2$ has a shallow recess 39 formed below the opening 36 for forming a mass 40 of synthetic resin thereat. It should be noted that the cross-sectional area of the recess 39 is larger than that of the opening 36. The lower molding block $M_2$ is further provided with a groove 41 for forming a runner 42, with one end portion thereof connected to the recess 39 and the other end portion thereof (not shown) connected to one of the neighboring recesses (not shown). After effecting the molding process in the manner as described above, the ejected part, i.e., the leaf spring 31, is fixedly mounted on the base plate B, because the mass 40 integrally connected with the leaf spring 31 through the opening 36 tightly engages the plate around the opening 36 due to the shrinkage of the synthetic resin in the opening 36.

Referring to FIGS. 16 and 17, the blanked out piece 37 is taken out of the opening 34 so that one end portion 33 of the leaf spring 31 partly crosses the opening 34.

It should be noted that the leaf spring 31 described as partly crossing the opening 34 can be replaced by any other projection which can be formed by molding, with respect to the mechanism to be employed in the device.

It should also be noted that the leaf spring 31 or any other projection partly crossing the opening 34 can be formed so as to completely cross the opening 34.

It should further be noted that the opening 34 described as having a rectangular shape can be formed in any other configurations such as an elongated groove or a circle, depending on the type of components of mechanism to be incorporated in the device.

Therefore, according to the present invention, the synthetic resin projection can be extended along the base plate to cross the opening formed in the base plate without any difficulty.

ITEM 3

Referring to FIGS. 18 and 19, there is shown completed molded projections P, namely a series of three guiding blocks 45, 46 and 47 fixedly mounted on the base plate B.

Referring to FIG. 20, each of the U-shaped guiding blocks has a groove 48 formed by two side projections 49 and 50. These three U-shaped guiding blocks 45, 46 and 47 are arranged at a straight row, spaced in a predetermined pitch from each other, in such a manner that respective grooves 48 of these three U-shaped blocks are in alignment with each other, so that these grooves 48 may serve to slidingly support a strip-like sliding member 51 thereon for actuating one part of the mechanism (not shown) employed in the device. These three U-shaped guiding blocks 45, 46 and 47 are fixedly mounted on the base plate B by lumps 52, 53 and 54 formed immediately below the base plate B, respectively at positions opposite the guiding blocks 45, 46 and 47. These lumps 52, 53 and 54 are connected to each other by runners 55 and 56.

It should be noted that one of the masses 52, 53 and 54, for instance, in this case the mass 54, is further connected with a runner 57 which leads to one of the neighboring masses (not shown).

In order to form such series of guiding blocks 45, 46 and 47 fixedly mounted on the base plate B, the metallic base plate B first has pairs of openings 58a, 58b, 59a, 59b, 60a and 60b formed therein as shown in FIG. 21. Each of the pairs is located at a position corresponding to one of the guiding blocks to be positioned. Then the metallic base plate B is held between the upper and lower molding blocks $M_1$ and $M_2$.

Referring to FIG. 22, the upper molding block $M_1$ has three recesses 61, 62 and 63 in alignment with each other, and each of the recesses has the configuration of the guiding block. The lower molding block $M_2$ has three shallow recesses 64, 65 and 66 in corresponding positions with the three recesses in the upper molding block for forming the masses 52, 53 and 54 of synthetic resin thereat. It should be noted that each of the shallow recesses formed in the lower molding block $M_2$ has a size large enough to cover the pair of openings formed in the base plate B.

In addition to three shallow recesses the lower molding block $M_2$ has two grooves 67 and 68 for connecting the three shallow recesses, and one groove 69 extending from one of the shallow recess, for instance, in this case the shallow recesses 66, towards one of the neighboring recess (not shown) for another projection.

When these upper and lower molding blocks $M_1$ and $M_2$ tightly hold the base plate B therebetween a cavity is formed around each of the pairs of openings, while each cavity is connected to the other by the grooves 67 and 68. Then it is readly for molding.

After effecting the molding process in the same manner as described above, the ejected parts, i.e., the series of guiding blocks 45, 46 and 47 are fixedly mounted on the base plate, because each of the masses 52, 53 and 54 integrally connected to each of the guiding blocks 45, 46 and 47 through the pair of openings 58a, 58b, 59a, 59b, 60a and 60b, tightly engages the base plate B, due to the shrinking of synthetic resin in the pair of openings.

It should be noted that the series of guiding blocks described above as formed separately on the base plate B can be further formed with comparatively thin-gauged connecting member 70 and 71 in the spaces formed between the three guiding blocks for connecting the guiding blocks integrally, as shown in FIG. 23.

It should also be noted that the series of guiding blocks described above as consisting of three separate guiding blocks can consist of more than three, or even two.

Since the relative positioning of the guiding blocks 45, 46 and 47 is precisely determined by the recesses 61, 62 and 63 formed in the upper molding block, it is not necessary to adjust each of the guiding blocks 45, 46 and 47 in its predetermined position after having been ejected from the mold, provided that the recesses 61, 62 and 63 are formed with accuracy.

Figure 24:
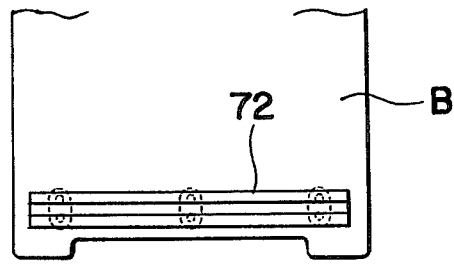
FIGS. 24 and 25 are fragmentary explanatory diagrams for the series of guiding blocks shown in FIGS. 18 to 23.
Figure 25:
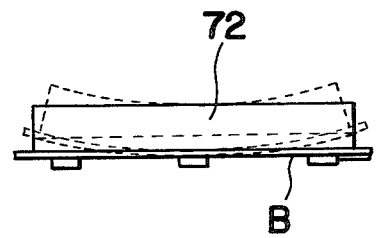
Figure 26:
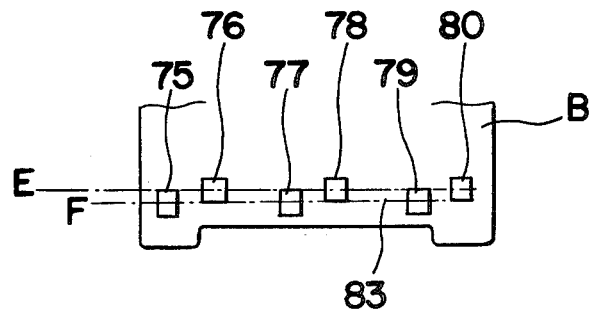
FIGS. 26 and 27 are similar views to FIGS. 18 and 19, but particularly show a modification thereof.
Figure 27:
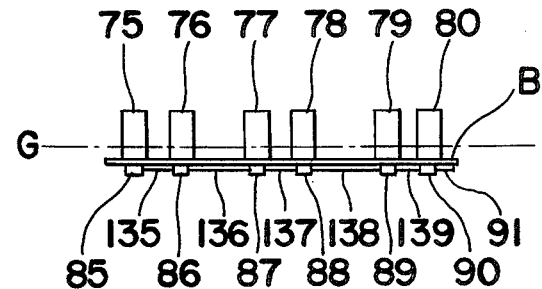
Figure 28:
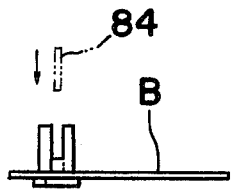
FIG. 28 is a side view of the series of guiding blocks shown in FIG. 27.

Although it is possible to form the guiding blocks in one integral elongated body 72, as shown in FIG. 24, such a guiding block is only suitable for small size guiding blocks, which do not need to take the shrinkage of the synthetic resin into consideration. However, when the size of the guiding block becomes comparatively large, the shrinkage of the synthetic resin may cause the metallic base due to the plurality of points of engagement between the guiding through a plurality of engaged points between the guiding block and the base plate, as shown in FIG. 25. Thus, it is preferable to form the guiding blocks in several pieces.

Therefore, according to the present invention, the elongated groove formed by the guiding blocks can be maintained with accuracy, because the degree of shrinking of the synthetic resin of each guiding block is not so large as to deform the configuration of the guiding block, and also the relative positioning between the blocks is precisely defined by the molding blocks which are preliminarily prepared with accuracy.

ITEM 4

Referring to FIGS. 34 to 37, there is shown a completed molded projection P, which is a modification of the series of guiding blocks 45, 46, and 47 described with respect to the Item 3. Instead of the three separate guiding blocks described as employed in the series of guiding blocks in Item 3, the series of guiding blocks in Item 4 are composed of eight upright blocks.

Before going into the detailed description of the series of eight guiding blocks shown in FIGS. 34 to 37, first, a series of six guiding blocks will described in connection with FIGS. 26 to 33, because it has a more fundamental construction.

Figure 29:
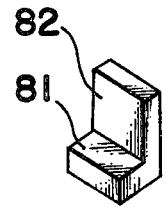
FIG. 29 is a perspective view of one of the guiding blocks shown in FIGS. 26 to 28.

Referring to FIGS. 26 to 32, there is shown the series of guiding blocks which are composed of six L-shaped blocks 75, 76, 77, 78, 79 and 80. Each of the L-shaped blocks has a seating surface 81 and an upright surface 82, as best shown in FIG. 29.

A first group of three of the six L-shaped blocks 76, 78 and 80 are arranged in a straight row, spaced a predetermined pitch from each other, and in such a manner that respective upright faces 82 of these three L-shaped blocks 76, 78 and 80 of said first group face in the same direction and lie on the same imaginary plane E perpendicular to the base plate B. On the other hand, a second group of the rest of the six L-shaped blocks 75, 77, and 79 are arranged in a substantially similar manner to those of said first group, but have their upright faces 82 facing in the opposite direction to the direction of the faces 82 those of the first group and lie on the same imaginary plane F which is in spaced parallel relation to said first mentioned imaginary plane E. These first and second groups of the L-shaped blocks are oppositely displaced a distance approximately equal to half the pitch in the direction of the straight row of the blocks of said first and second groups. The seating surfaces 81 of the L-shaped blocks of the first and second groups are disposed in a space defined between the two imaginary planes E and F, laying on the imaginary plane G perpendicular to said two imaginary planes E and F and parallel to the plane of the base plate, and spaced upwardly from and facing away from the base plate B.

Therefore, the space defined by the imaginary planes E, F and G forms an elongated groove 83 and the upright surfaces 82 and seating surfaces 81 of the blocks of the first and second groups serve to alternately support the strip-like slidable plate member 84 thereon as described in connection with Item 3.

Positioned under the L-shaped blocks 75, 76, 77, 78, 79, and 80 are respectively masses 85, 86, 87, 88, 89 and 90 of synthetic resin, integrally formed with each of the L-shaped blocks through a pair of opening formed in the base plate. The cross-sectional area of each mass is larger than that of the pair of openings, so that each L-shaped block is fixedly mounted on the base plate B. It should be noted that these masses 85, 86, 87, 88, 89 and 90 are connected to each other by runners 135, 136, 137, 138 and 139, and also the mass 90 is further connected to the neighboring mass (not shown) by a runner 91.

Figure 30:
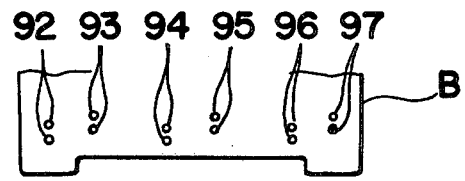
FIG. 30 is a fragmentary top plan view of the base plate for forming series of guiding blocks shown in FIGS. 26 to 28.
Figure 31:
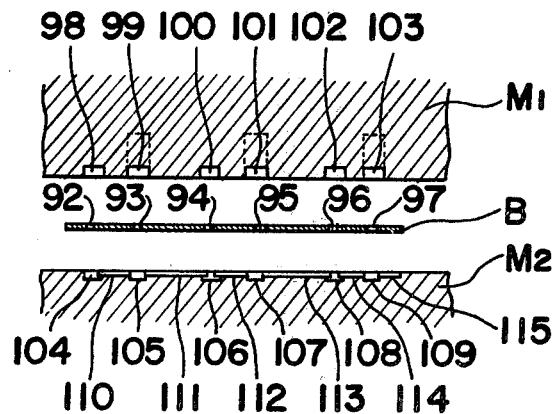
FIG. 31 is a fragmentary side sectional view of the series of guiding blocks shown in FIGS. 26 to 28, showing the relation between the upper and lower molding blocks.

In order to form such series of guiding blocks 75 to 80, the metallic base plate B first has pairs of openings 92, 93, 94, 95, 96 and 97 formed therein at positions corresponding to each of the L-shaped blocks 75, 76, 77, 78, 79 and 80 as shown in FIG. 30. Then, the base plate B is tightly held between upper and lower molding blocks $M_1$ and $M_2$, as best shown in FIG. 31. The upper molding block $M_1$ has recesses 98, 99, 100, 101, 102 and 103 with the shape thereof corresponding with the configuration of the series of the L-shaped blocks, while the lower molding block $M_2$ has shallow recesses 104, 105, 106, 107, 108 and 109 with the shape thereof corresponding with the masses to be formed under each of the L-shaped blocks. The lower molding block $M_2$ is further provided with grooves 110, 111, 112, 113 and 114 which connect each of the shallow recesses, and also one of the shallow recesses, in this case the shallow recess 109, is provided with a groove 115 which connects with one of the neighboring shallow recesses (not shown) for the supply of synthetic resin.

After effecting the molding process in the same manner as described above, the ejected parts, i.e., the series of L-shaped guiding blocks are fixedly provided on the base plate B, because each of the masses 85 to 90 being integrally connected to each of the L-shaped guiding blocks through the pair of openings 92 to 97, tightly engages the base plate B due to the shrinkage of synthetic resin in the openings.

It should be noted that the L-shaped blocks described as being six in number can be composed of any number more than three.

Figure 33:
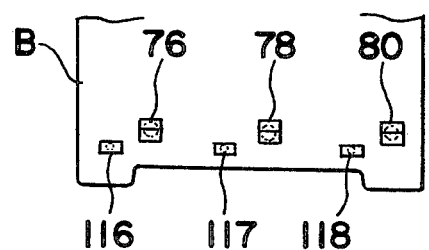
FIG. 33 is a similar view to FIG. 26, but particularly shows a modification thereof.

Referring to FIG. 33, there is shown a modification of the series of guiding blocks. In this embodiment, either one of the two groups described as being composed of three L-shaped guiding blocks, for example, the three L-shaped blocks 75, 77 and 79 in the second group can be replaced by three blocks 116, 117 and 118 each having the configuration of a rectangular parallelpiped block, with one of the surfaces on the imaginary plane F and yet the effect is the same as in the former embodiment.

It should be noted that the series of guiding blocks described as composed of L-shaped blocks, can all be blocks having the configuration of a rectangularly parallelpiped block, and the blocks in the first and second groups have their one surface on the imaginary planes E and F, respectively, while the imaginary surface G is defined by the surface of the base plate B, thus the plate member is supported directly on the base plate B. In this case, the blocks in the first and second groups can either be arranged in the above described manner or in such a manner that the surfaces defining the imaginary surfaces E and F are in directly opposed positions.

Figure 34:
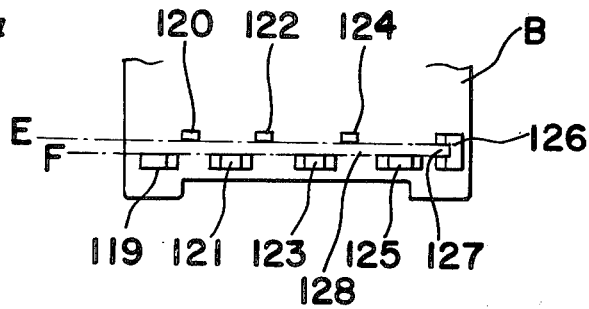
FIGS. 34 to 36 are similar views to FIGS. 26 to 28, but particularly show a modification thereof.
Figure 35:
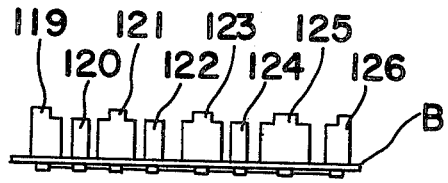
Figure 36:
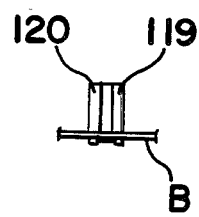

Referring now to FIGS. 34 to 36, the series of eight guiding blocks are composed of seven blocks 119 to 125, alternately disposed on the imaginary surfaces F and E, and an end block 126 disposed adjacent to the block 125. The end block 126 has with cut off portion 127 in which are the end edges of the imaginary planes E and F.

Therefore, the space defined by the imaginary planes E, F and the surface of the base plate B define an elongated groove 128, while the cut off portion 127 defines the end of the groove 128. In this groove 128, the slidable plate member 84 can be reciprocally supported, as described above.

Figure 37:
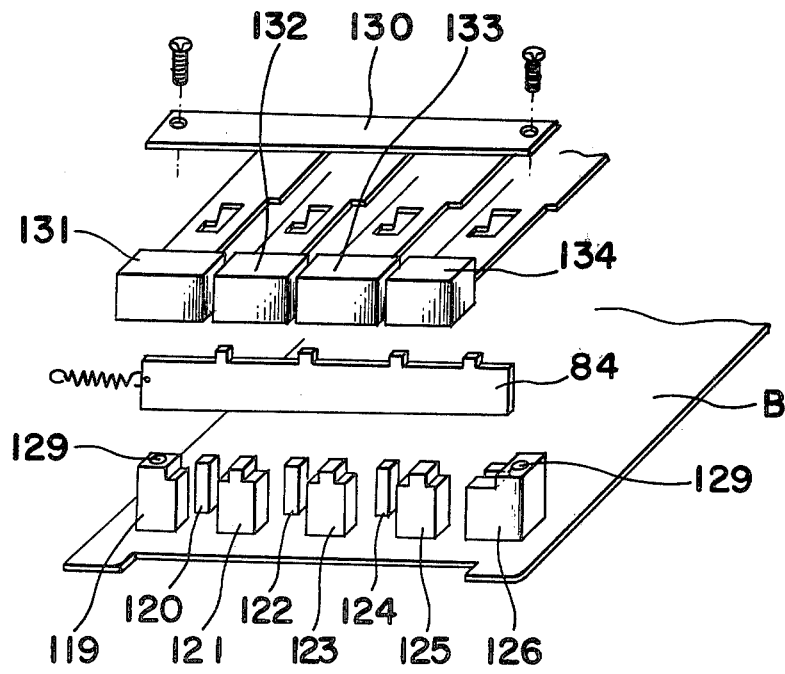
FIG. 37 is an exploded perspective view of the guiding blocks shown in FIGS. 34 to 36, showing a part of mechanism to be coupled with the guiding blocks.

Referring to FIG. 37, the block 119 and the end block 127 have a screw hole 129 at top surface thereof for rigidly securing a plate 130 over the groove 128. After placing the slidable plate member 84 coupled with push buttons 131, 132, 133 and 134 into the groove 128, the plate 130 covers the groove 128 for preventing the slidable plate member 84 from being forced out of the groove 128.

This series of guiding blocks is suitable especially for supporting sliding plate member with large width.

Figure 32:
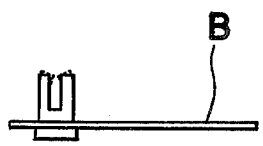
FIG. 32 is an explanatory diagram for the series of guiding blocks shown in FIGS. 26 to 28.

Assuming the series of U-shaped guiding blocks described in Item 3 were to support such a plate member having a large width, each of the U-shaped blocks have to be prepared with comparatively high side projections, for preventing the plate member from falling out of the groove. However, such a U-shaped guiding block with high side projections undergoes a comparatively great degree of shrinkage during molding and cooling, which will deform the U-shaped block in such a manner that the side projections thereof may curve inwardly toward each other, as shown in FIG. 32. Therefore, the side projections may not maintain the space between the side projections for supporting the plate member evenly along the side projections.

On the other hand, with the guiding blocks of Item 4, the space for supporting the plate member is defined by the upright surface of the each L-shaped block. Since these L-shaped blocks are formed individually, the shrinkage takes place in a direction along the upright surface. Therefore, with the guiding blocks of the present invention, the space for supporting the plate member is maintained accurately along the upright surface.

ITEM 5

Figure 38:
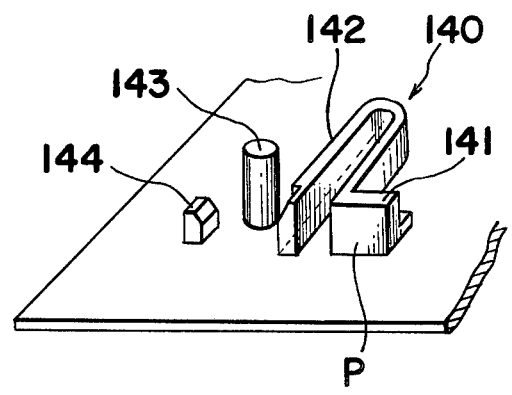
FIG. 38 is a fragmentary perspective view of a U-shaped leaf spring together with accessory parts therefor installed on the base plate.

Referring to FIG. 38, there is shown a completed molded projection namely a U-shaped leaf spring 140 with accessory parts which are fixedly provided on the metallic base plate B. One end portion 141 of the U-shaped leaf spring 140 is fixedly mounted on the base plate B, while the other end portion 142 of the U-shaped leaf spring 140 is free from the base plate B, being resiliently urged towards one of the components contained in the device. Adjacent to the free end portion 142 of the U-shaped leaf spring 140 is a pin projection 143 for receiving said one of the components thereon, and adjacent to the pin projection is an engaging projection 144.

Figure 39:
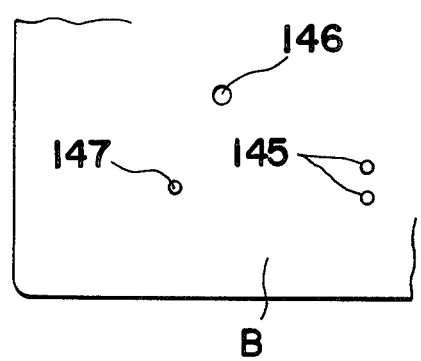
FIG. 39 is a fragmentary top plan view of the base plate showing openings for forming the U-shaped leaf spring and accessory parts therefor.
Figure 40:
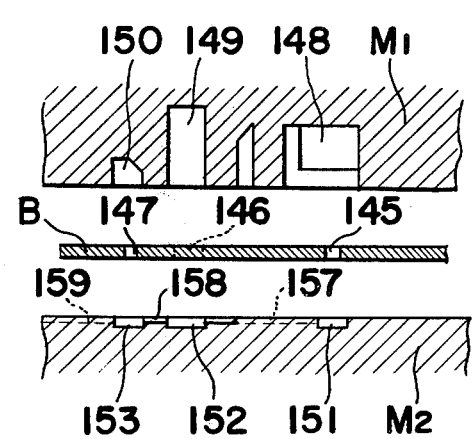
FIG. 40 is a fragmentary side sectional view showing the relation between the base plate and the upper and lower molding blocks for forming the U-shaped leaf spring and accessory parts therefor.
Figure 41:
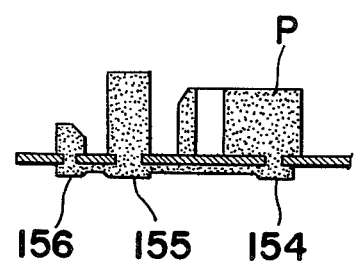
FIG. 41 is a schematic sectional view of the ejected U-shaped leaf spring and accessory parts therefor.

In order to form such projections, the metallic base plate B first has openings 145, 146 and 147 formed therein, as shown in FIG. 39. Then, the metallic base plate B is tightly held between the upper and lower molding blocks M₁ and M₂, as shown in FIG. 40. The upper molding block M₁ has three recesses 148, 149 and 150, which correspond with the configuration of the U-shaped leaf spring 140, the pin projection 143, and the engaging projection 144. On the other hand, the lower molding block M₂ has three shallow recesses 151, 152 and 153, formed immediately below the openings 145, 146 and 147, for forming masses 154, 155 and 156 of synthetic resin thereat as best shown in FIG. 41. It should be noted that the cross-sectional areas of the shallow recesses 151, 152 and 153 are larger than that of the openings 145, 146 and 147, respectively. The lower molding block M₁ further has grooves 157, 158 and 159 extending from the shallow recess 152. The grooves 157 and 158 are connected to the shallow recesses 151 and 153, while the groove 159 is connected to one of the neighboring shallow recesses (not shown). After effecting the molding process in the manner described above, the ejected parts, i.e., the U-shaped leaf spring 140 with accessory parts, are fixedly provided on the metallic plate B in the pedetermined positions, and are ready for use, because the masses 154, 155 and 156 are integrally connected with the projections through the openings 145, 146 and 147 and tightly engages the plate around the openings due to the shrinkage of synthetic resin in the opening.

Figure 42:
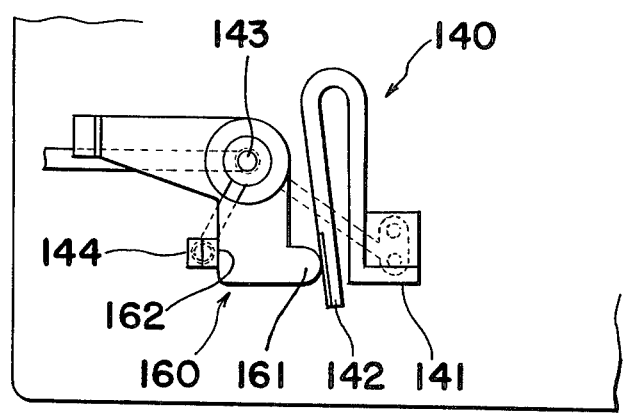
FIG. 42 is a fragmentary top plan view of the U-shaped leaf spring and accessory parts therefor showing a part of mechanism coupled therewith.
Figure 43:
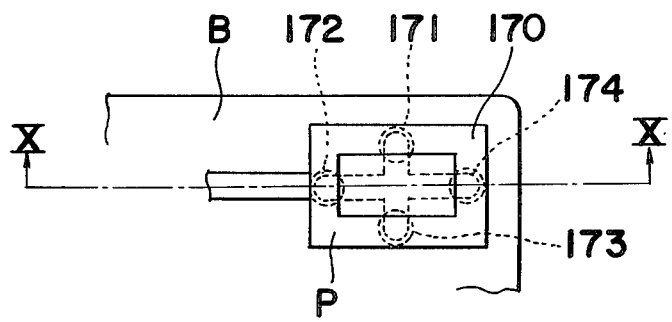
FIG. 43 is a fragmentary top plan view of a projecting case.
Figure 44:
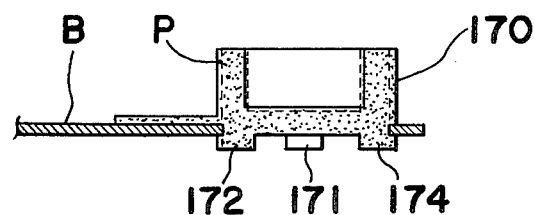
FIG. 44 is a cross sectional view taken along the line X—X of FIG. 43.

Since the U-shaped spring 140 is fixedly held at one end portion 141, the other end portion 142 thereof can serve as a spring means acting on one of the components in the device, for example, a lever 160, as shown in FIG. 42.

Referring to FIG. 42, the lever 160 is rotatably mounted on the pin projection 143 and also displacably along the pin projection 143. Normally, one corner portion 161 of the lever 160 is in contact with the U-shaped spring 140 at the end portion 142, while the another corner portion 162 is engaged with the engaging projection 144, thus maintaining the position of the lever 160 between the U-shaped leaf spring 140 and the engaging projection 144. Upon receipt of a suitable external force, the lever 160 is shifted upwardly a suitable distance to disengage from the engaging projection 144, whereby the lever 160 is rotated about the pin projection 143 in the clockwise direction for a predetermined number of degress by the urging force of the leaf spring 140 so that the lever 160 will be positioned in one operating position. On the other hand, another suitable external force can return the lever 160 to its normal engaged position.

It should be noted that the finished pieces, i.e., the U-shaped leaf spring 140 described as being obtained by the molding process can be formed in any desirable configuration, since synthetic resin can be formed into any desirable shapes depending on the configuration of the mold. For example, the end portion 142 of the leaf spring 140 can be tapered as well as the engaging projection 144, as most clearly seen in FIG. 41.

It should also be noted that the leaf spring 140 described as having a U-shape configuration, can have other shapes, for example other shapes of the leaf spring are available, for example the leaf spring with a configuration of a plain sheet can be employed.

Therefore, according to the present invention, the synthetic resin projection can be molded as the spring means by utilizing the elastic force of the synthetic resin.

ITEM 6

Referring to FIGS. 43 to 48, there is shown a completed molded projection P, namely a projecting case 170, being fixedly mounted on the base plate B. Under the base plate B are four masses 171, 172, 173 and 174 of synthetic resin positioned immediately below the center of the each side of the box-like case 170.

Figure 45:
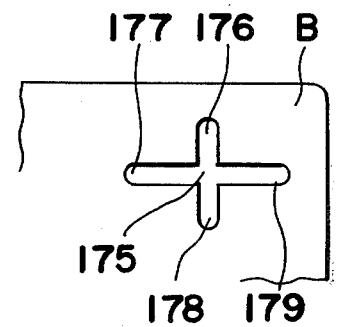
FIG. 45 is a fragmentary top plan view of the base plate showing an opening for forming the case shown in FIG. 43.
Figure 46:
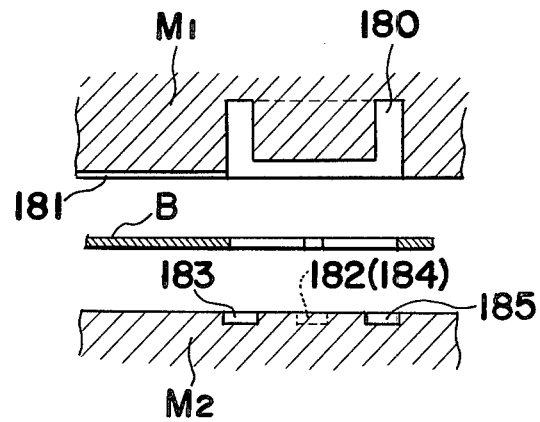
FIG. 46 is a side sectional view showing the relation between the base plate and the upper and lower molding blocks for forming the case shown in FIG. 43.

In order to form such a case, the base plate B first has an opening 175 therein having four branches 176, 177, 178 and 179 in a form of the cross, as shown in FIG. 45, which is substantially equal to the cross formed by connecting the opposite masses, i.e., the mass 171 with the mass 173, and the mass 172 with the mass 174. It should be noted that the width of the each branch in the cross is no wider than the diameter of the each mass. Then, the base plate B is tightly held between the upper and lower molding blocks M₁ and M₂ as best shown in FIG. 46. The upper molding block M₁ has a recess 180 which corresponds with the configuration of the case 170 and a groove 181 extending from said recess towards one of the neighboring recesses (not shown). On the other hand, the lower molding block M₂ has four shallow recesses 182, 183, 184 and 185 which correspond with the masses 171, 172, 173 and 174. After effecting the molding process in the same manner as described above, the ejected part, i.e., the case 170, is fixedly mounted on the base plate B, because the masses 171, 172, 173 and 174 are integrally connected with the case 170 through the opening 175 and tightly engage the plate around opening 175 due to the skrinkage of the synthetic resin in the openings.

The reason for forming the cross-shaped opening in the base plate is that the masses 171, 172, 173 and 174 formed at the ends of the cross may shift along the branches 176, 177, 178 and 179 of the opening towards the center portion thereof when shrinking proceeds in the case 170, and yet still the masses will tightly hold the base plate.

Figure 47:
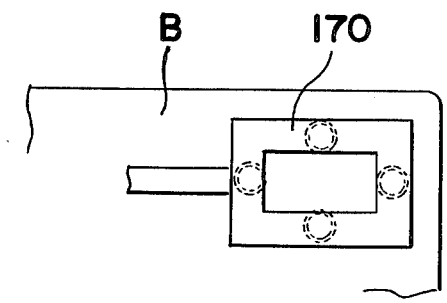
FIGS. 47 and 48 are explanatory diagrams for the case projection shown in FIG. 43.
Figure 48:
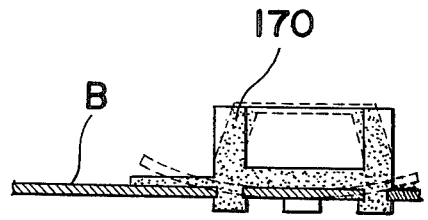
Figure 49:
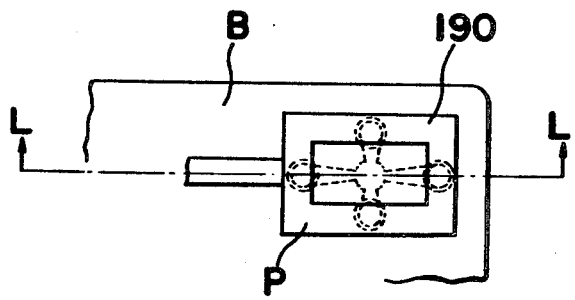
FIG. 49 is a similar view to FIG. 43, but particularly shows a modification thereof.
Figure 50:
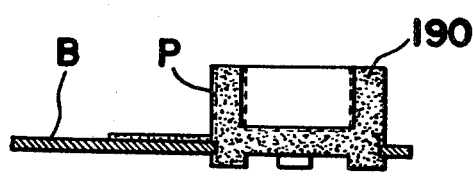
FIG. 50 is a cross sectional view taken along the line L—L of FIG. 49.

If there were no cross-shaped opening in the base plate B, but only four openings at the ends of the cross, as shown in FIG. 47, the would not allow the base portion of the case 170 to move as the material contracted during cooling, while the upper rim portion of the case could shrink inwardly so that the case itself would become deformed and take the shape of a frustum of a square pyramid, as shown in FIG. 48.

Therefore, the case 170 formed in the opening 175 in a shape of the cross is especially suitable for cases which require high accuracy in their sizes.

It should be noted that the case 170 described as formed in the cross-shaped opening 175 can be replaced by any other type of projection which is formed by a large mass of synthetic resin.

It should also be noted that the opening 175 described as formed in the shape of a cross is not limited to a cross with four branches 176, 177, 178 and 179 but crosses with more than four branches can be employed, or the branches in the shape of a 'Y' can be employed, as long as the branches extend in radial directions from the center of the opening, and if possible, it is better to make the center of the opening coincide with the center of the base of the molded synthetic resin part.

ITEM 7

Referring to FIGS. 49 to 52, there is shown a completed molded projection P, which has the same configuration as that of the case 170 described in connection with the Item 6. However the case 190 in this Item 7 is molded in a different shape opening formed in the base plate B. Since the configuration of the case 190 and the recesses to be formed in the upper and lower molding blocks are exactly same as those described for the Item 6, a detailed explanation thereof is omitted. Therefore, in this Item 7, the description is mainly directed to the opening to be formed in the base plate B.

Figure 51:
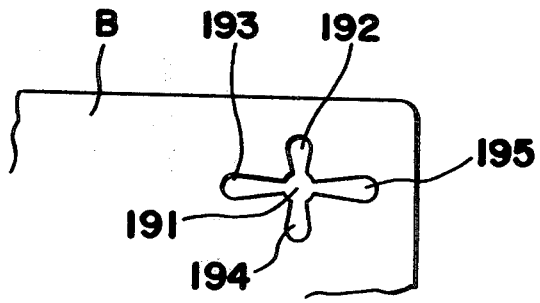
FIG. 51 is a similar view to FIG. 45, but particularly shows a modification thereof.

Referring to FIG. 51, there is shown an opening 191 having four branches 192, 193, 194 and 195 formed in the base plate B. Although this opening 191 too has the form of a cross, each of the four branches does not have a uniform width as do the branches in the Item 6, but has a width which grows larger towards the end of the branches.

It should be noted that the width at the end of the each branch is not as large as the width of the masses to be formed thereat, even if the width of the branches grows large towards the end.

Figure 52:
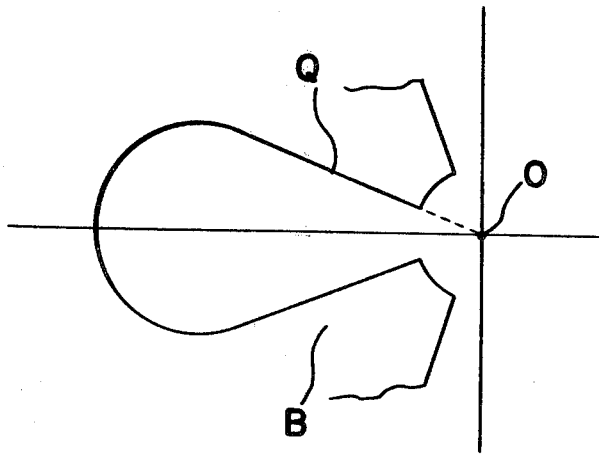
FIG. 52 is a similar view to FIG. 51, but particularly shows the detailed construction thereof on an enlarged scale.

Referring to FIG. 52, there is shown one of the branches of the opening on an enlarged scale. The edge of the branch extends along a line extending radially from the geometrical center point 0. In other words, the edge of the opening itself is directed towards the geometrical center point 0. In the same manner, all the other edges forming the opening are directed towards the geometrical center point 0.

Since the molten synthetic resin filled in the opening 191 tends to shrink towards the geometrical center point 0, a particle of the molten synthetic resin positioned at Q also tends to shrink towards the geometrical center point 0; in other words it shrinks along the edge thereof. Therefore, the molten synthetic resin filled in the opening 191 will shrink along the opening without leaving any space between the edge of the synthetic resin and the edge of the opening, nor producing any intolerable force on the base plate to such an extent as to deform the base plate.

It should be noted that the projection described as formed in the crossing opening can be replaced by any other type of projection which is formed by a large mass of synthetic resin.

It should also be noted that the opening described as being formed in the shape of a cross in not limited to a cross with four branches but crosses with more than four branches are useful, as long as the branches extend in the radial directions with their edges coinciding with a line radially extending from the geometrical center point of the opening. If possible, it is preferable to make the said geometrical center point coincide with the center point of the base of the molded synthetic resin piece.

Therefore, according to the present invention, it is possible to form a synthetic resin projection with a large sizes, without deforming the configuration of the projection or causing the base plate to curve inwardly, due to the shrinkage of the synthetic resin, because the shrinking force of the synthetic resin is totally absorbed within the projection itself.

ITEM 8

Before going into a detailed description of Item 8, it is to be noted that the descriptions up to the Item 7 have been directed to each of the projections on the base plate, while the descriptions in the Items from 8 to 14 are directed to the runners connecting two projections. Although there is no problem with the runners the shrinkage of which hardly affects the base plate or the projections except for merely connecting two neighboring projections, there are problems with those runners which connect two projections spaced from each other by a comparatively large distance, as described hereinbelow.

Figure 57:
FIG. 57 is a diagram explanatory of the runner connecting the two boss projections.
Figure 58:
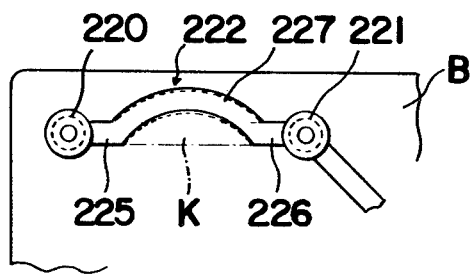
FIGS. 58 and 59 are fragmentary top and front views of a runner connecting two boss projections.

First, when the runners are comparatively long, the shrinkage of the runners especially in the longitudinal direction thereof may cause the base plate to curve inwardly depending on to the degree of shrinkage of the runners, as shown in FIG. 57.

Figure 75:
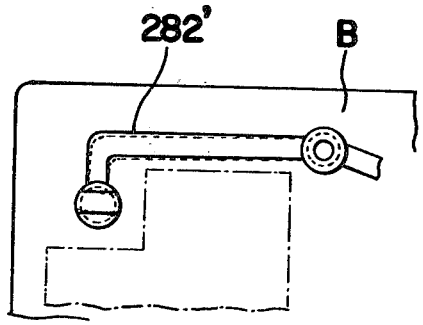
FIG. 75 is a diagram explanatory of the L-shaped runner shown in FIGS. 70 and 72.
Figure 76:
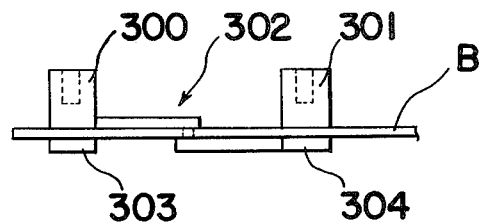
FIG. 76 is a fragmentary side elevational view of a runner connecting the two boss projections.

Secondly, when the runners are comparatively long, the shrinkage thereof causes the two connected projections to tilt inwardly towards each other, or otherwise to rotate the projection undesirably if the runners extend in an L-shape, as shown in FIG. 75.

Figure 79:
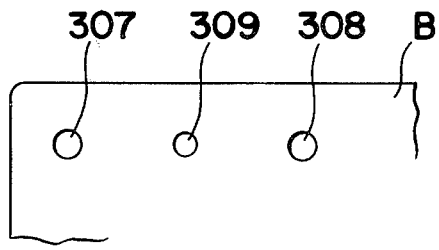
FIG. 79 is a fragmentary top plan view of the base plate showing openings for forming the two boss projections and the runner shown in FIG. 76.

Thirdly, when the runners are comparatively long, such runners may hinder other projections which must be installed between the two projections being connected by the runners, as shown in FIG. 79.

In order to solve these problems, runners described in the Items from 8 to 14 are provided.

It should be noted that a runner formed by a groove which is formed in the molding block between recesses for allowing molten synthetic resin to flow therethrough may be cleared away from the framework after being ejected from the mold, but such a clearing away process results in an increase in the manufacturing cost for manufacturing the framework.

Figure 53:
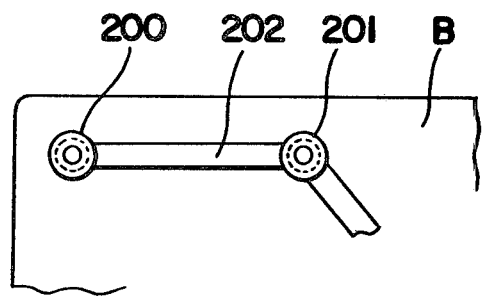
FIGS. 53 and 54 are fragmentary top and front views of runners connecting two boss projections.
Figure 54:
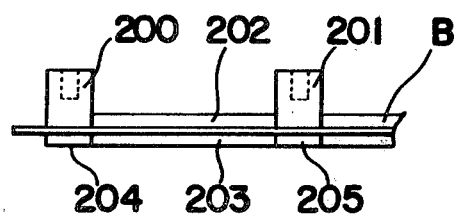
Figure 55:
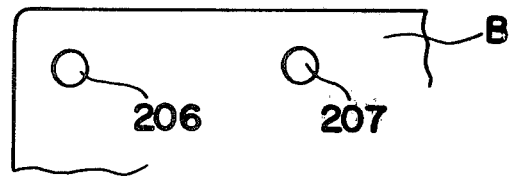
FIG. 55 is a fragmentary top plan view of the base plate showing openings for forming the boss projections shown in FIGS. 53 and 54.
Figure 56:
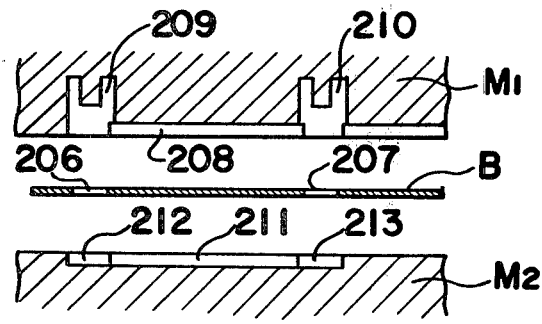
FIG. 56 is a fragmentary side sectional view showing the relation between the base plate and the upper and lower molding blocks for forming the boss projections together with the runners shown in FIGS. 53 and 54.

Referring to FIGS. 53 and 54, there are shown two completed boss projections 200 and 201, which are connected to each other with runners 202 and 203 provided on both side of the base plate B. Each of the two boss projections 200 and 201 is a cylindrical projection with a coaxial cylindrical recess in the top portion thereof, and is fixedly mounted on the base plate B by masses 204 and 205 formed immediately blow the base plate B at positions opposite the boss projections 200 and 201, respectively. The runner which connects the bottom portion of the boss projection 200 with the bottom portion of the boss projection 201 is straight, while the runner 203 which connects the mass 204 with the mass 205 has exactly the same form as the runner 202. It is to be noted that at least one of the boss projections is connected to a neighboring projection. In order to form such runners 202 and 203 between the two boss projections 200, and 201 the base plate B first has two openings 206 and 207 formed therein, as shown in FIG. 55. Then, the base plate B is sandwiched between upper and lower molding blocks $M_1$ and $M_2$, as shown in FIG. 56. The upper molding block $M_1$ is provided with a groove 208 which connects two recesses 209 and 210 for molding boss projections 200 and 201, while the lower molding block $M_2$ is provided with a groove 211 connecting two shallow recesses 212 and 213 for the masses 204 and 205, respectively.

After effecting the molding process in the same manner as described above, the ejected runners 202 and 203 connect the boss projections 209 and 210 in the manner as described above.

Since the runners provided on both sides of the base plate B have exactly the same form, the degree of the shrinkage taking place in the runners 202 and 203 is also exactly the same. Therefore, the shrinking force in the runner 202 is exactly the same as the shrinking force in the runner 203, thus resulting in precise positioning of the projection.

Therefore, according to the present invention, the shrinking force of the runners connecting the two boss projections does not affect the base plate, because said shrinking force of the runner 202 is balanced by that of the runner 203 provided on the opposite side of the base plate from the runner 202.

ITEM 9

Referring to FIGS. 58 to 61, there is shown two completed boss projections 220 and 221 being connected by a runner 222, extending between the two boss projections 220 and 221. Each of the two boss projections 220 and 221 are fixedly mounted on the base plate B by masses 223 and 224 formed immediately below the base plate B at positions opposite the boss projections 220 and 221, respectively. The two opposite end portions 225 and 226 of the runner 222 lie along an imaginary straight path K, connecting the boss projections 220 and 221, while the intermediate portion 227 of the runner 222 is curved laterally substantially in the form of an arc from the imaginary straight path K on the base plate B.

Figure 60:
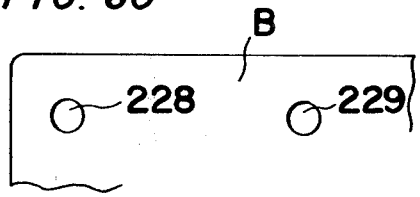
FIG. 60 is a fragmentary top plan view of the base plate showing openings for forming the boss projections shown in FIGS. 58 and 59.

In order to form such a runner 222 between the boss projections 220 and 221, the base plate B has two openings 228 and 229 formed therein, as shown in FIG. 60. Then, the base plate B is sandwiched between the upper and lower molding blocks $M_1$ and $M_2$. The upper molding block $M_1$ has a groove 230 connecting two recesses 231 and 232 for the boss projections 220 and 221, while the lower molding block $M_2$ has only shallow recesses 233 and 234 for forming the masses 223 and 224 thereat to hold the boss projection 220 and 221, respectively. The groove 230 in the upper molding block $M_1$ corresponds to the shape of the runner 222.

After effecting the molding process in the same manner as described above, the ejected runner 222 will shrink to some degree while cooling. However, since the runner 222 is not straight between the two boss projections 220 and 221, the distorting force due to the shrinking of the runner does not affect the boss projections nor the base plate B. In other words, the distortion of the runner 222 is totally absorbed by the curved portion 227 of the runner 222, causing the curvature of the curved portion 227 to be lessened to some degree by the shrinkage as shown by the dotted lines in FIG. 58.

Figure 62:
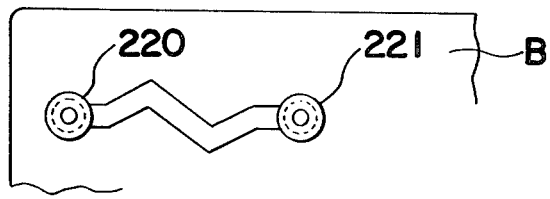
FIG. 62 is a similar view to FIG. 58, but particularly shows a modification thereof.
Figure 67:
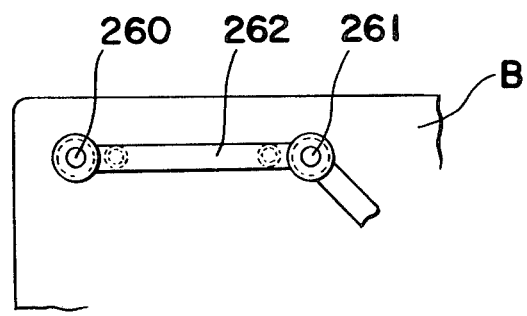
FIGS. 67 and 68 are similar views to FIGS. 58 and 59, but particularly show a modification thereof.
Figure 68:
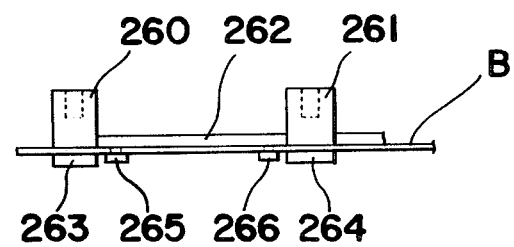

It should be noted that the intermediate portion 227 of the runner 222 described as formed in the shape of an arc can be formed in any other form other than a straight line, such as in the form of a zigzag line, as shown in FIG. 62, which will produce the same effect as described above.

It should be noted that the runner 242 described as being formed on the upper surface of the base plate B can be formed on the lower surface of the base plate B.

Therefore, according to the present invention, the runner 222, connecting the two boss projections does not affect the base plate nor the boss projections by its shrinking, because the wave or zigzag form of the runner absorbs the distortion due to the shrinking.

ITEM 10

Figure 63:
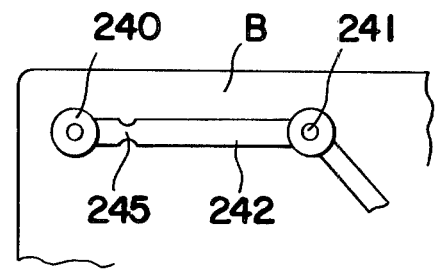
FIGS. 63 and 64 are similar view to FIGS. 58 and 59, but particularly show a modification thereof.
Figure 59:
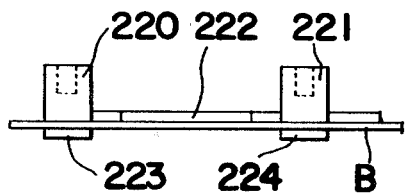
Figure 64:
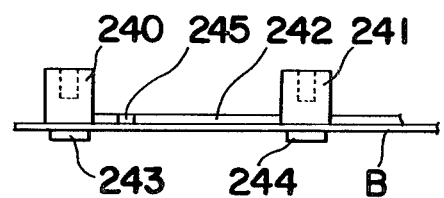
Figure 65:
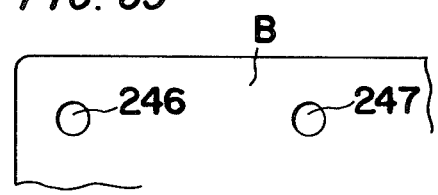
FIG. 65 is a fragmentary top plan view of the base plate showing openings for forming the boss projection shown in FIGS. 63 and 64.
Figure 61:
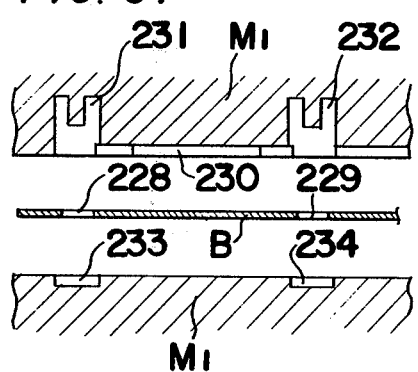
FIG. 61 is a fragmentary cross sectional view showing the relation between the base plate and the upper and lower molding blocks for forming the boss projections together with the runner shown in FIGS. 58 and 59.
Figure 66:
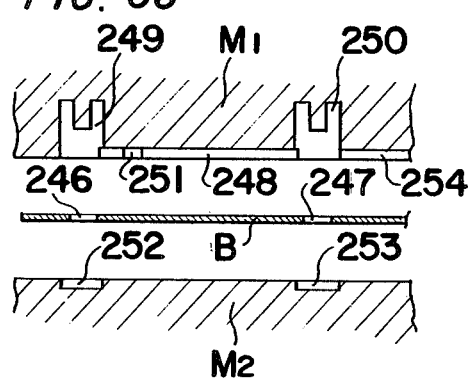
FIG. 66 is a fragmentary side sectional view showing the relation between the base plate and the upper and lower molding blocks for forming the boss projection together with the runner shown in FIGS. 63 and 64.

Referring to FIGS. 63 to 65, there is shown being two boss projections 240 and 241, being connected to each other by a straight runner 242 extending between the bottoms of the boss projections 240 and 241. Each of the two boss projections 240 and 241 are fixedly mounted on the base plate B by masses 243 and 244 formed immediately below the base plate B at positions opposite the boss projections 240 and 241, respectively. The runner 242 has at least one narrowed portion 245 formed at an intermediate portion thereof.

In order to form such a runner 242 between the boss projections 240 and 241, the base plate B first has two openings 246 and 247 formed therein, as shown in FIG. 65. Then the base plate B is sandwiched between upper and lower molding blocks $M_1$ and $M_2$. The upper molding block $M_1$ is provided with a groove 248 connecting two recesses 249 and 250 which are provided for molding the boss projections 240 and 241. The groove 248 has a narrowed portion 251 at a position corresponding to the narrowed portion 245 of the runner 242. On the other hand, the lower molding block $M_2$ only has shallow recesses 252 and 253 for forming the masses 243 and 244 thereat to hold the boss projections 240 and 241, respectively. It should be noted that the recess 250 is connected to another groove 254 for allowing the molten synthetic resin therefrom into the recess 250 and further to the recess 249.

After effecting the molding process in the same manner as described above, the ejected runner 242 will shrink to some degree, mostly in the longitudinal direction thereof, during cooling.

Since the runner 242 has the narrowed portion 245 therein, such shrinking in the runner 242 will be mostly absorbed in the narrowed portion 245, because the distorting force is most likely to affect the narrowed portion 245 in a manner to stretch the narrowed portion rather than to tilt the two boss projections 240 and 241 towards each other or bend the base plate B.

It should be noted that the narrowed portion 251 in the groove 248 is preferably formed at a position close to the recess 249, because in the process of molding, less molten synthetic resin passes through the narrowed portion 251 in the groove 248, when compared with such a groove (not shown) which has the narrowed portion close to the recess 250, which would require a large amount of molten synthetic resin to pass through the narrowed portion.

It should also be noted that the runner 242 described as formed on the upper surface of the base plate B can be formed on the lower surface of the base plate B, and still producing the same effect. In this case, the runner 242 is formed between the masses 243 and 244.

Therefore, according to the present invention, most of the force due to shrinkage of the runner 242 causes the narrowed portion 245 to be stretched, thus hardly affecting the base plate or the boss projections so as to deform their configurations.

ITEM 11

Referring to FIGS. 67 to 70, there is shown two boss projections 260 and 261 connected by a runner 262 extending between the boss projections 260 and 261. Each of the two boss projections 260 and 261 are fixedly mounted on the base plate B by masses 263 and 264 formed immediately below the base plate B at positions opposite the boss projections 260 and 261, respectively. The runner 262 is also fixedly mounted on the base plate B by masses 265 and 266 formed immediately below the base plate B at positions adjacent to the masses 263 and 264, and on the line connecting the masses 263 and 264.

Figure 69:
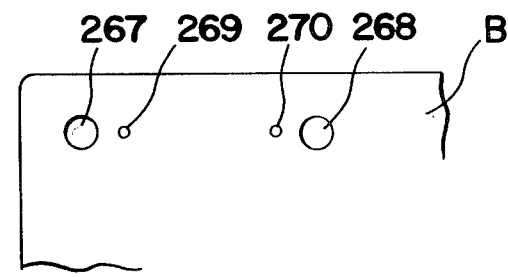
FIG. 69 is a fragmentary top plan view of the base plate showing openings for forming the two boss projections and runner shown in FIGS. 67 and 68.
Figure 70:
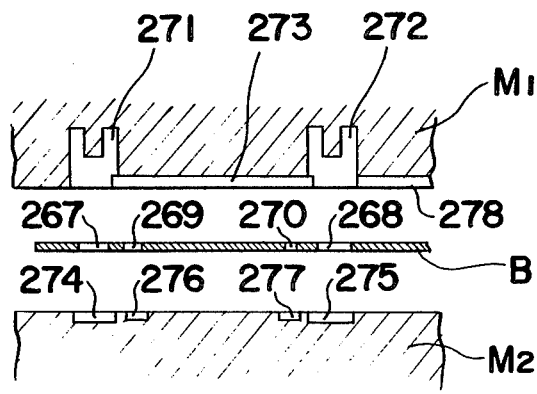
FIG. 70 is a fragmentary side sectional view showing the relation between the base plate and the upper and lower molding blocks for forming the boss projection together with the runner shown in FIGS. 67 and 68.

In order to form such a runner 262 connecting the boss projections 260 and 261, the base plate B first openings 267, 268, 269 and 270 formed therein. The larger openings 267 and 268 are provided for integrally connecting the boss projections 260 and 261 with the masses 263 and 264, respectively, while the smaller openings 269 and 270 are provided for integrally connecting the runner 262 with the masses 265 and 266. Then, the base plate B is sandwiched between the upper and lower molding blocks $M_1$ and $M_2$ as shown in FIG. 69. The upper molding block $M_1$ has two recesses 271 and 272 for molding the boss projections 260 and 261, and also has a groove 273 extending between the recesses 271 and 272. On the other hand, the lower molding block $M_2$ has four shallow recesses 274, 275, 276 and 277.

The shallow recesses 274 and 275 are for molding the masses 263 and 264, respectively, while the shallow recesses 276 and 277 are for molding the masses 265 and 266, respectively.

It should be noted that the recess 272 is further connected with another groove 278 for receiving the molten synthetic resin therefrom into the recess 272 and further to the recess 271.

After effecting the molding process in the same manner as described above, the ejected runner 262 may shrink to some degree, mostly in the longitudinal direction thereof, during cooling. Since the runner 262 is fixedly held on the base plate B by the masses 265 and 266 integrally formed with the runner 262, the shrinking of the runner 262 mostly takes place in the runner portion between the two masses 265 and 266. Therefore, the effect of the shrinking has hardly any effect on the boss projections 260 and 261, so that the boss projections 260 and 261 can be maintained in the predetermined position even when the runner portion between the two masses 265 and 266 shrinks to some degree.

It should be noted that the runner 262 described as formed integrally with the two masses 265 and 266 can be formed with only one mass positioned approximately at the center portion of the runner 262, or more than two masses with respect to the length of the runner 262 to be formed between the boss projections.

It should also be noted that the runner 242 described as formed on the upper surface of the base plate B can be formed on the lower surface of the base plate B.

Therefore, according to the present invention, the force due to shrinking of the runner 262 is mostly taken up by the masses 265 and 266, thus preventing said shrinking force from affecting on the boss projections.

ITEM 12

Figure 71:
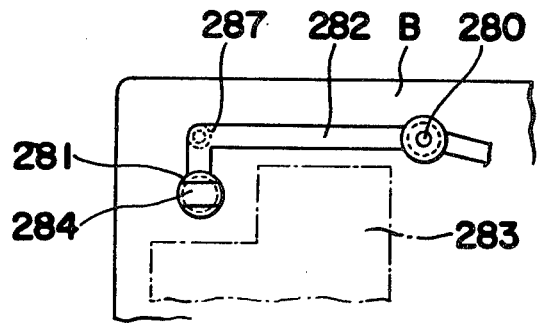
FIGS. 71 and 72 are fragmentary top and front views of an L-shaped runner connecting the boss projections.
Figure 72:
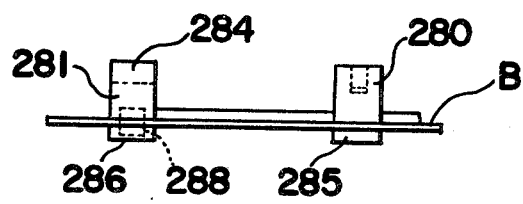
Figure 73:
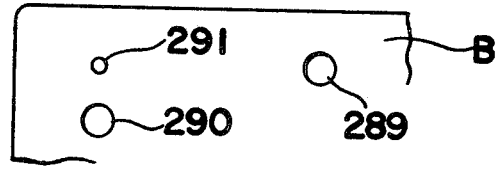
FIG. 73 is a fragmentary top plan view of the base plate showing openings for forming the two boss projections and the L-shaped runner shown in FIGS. 71 and 72.
Figure 74:
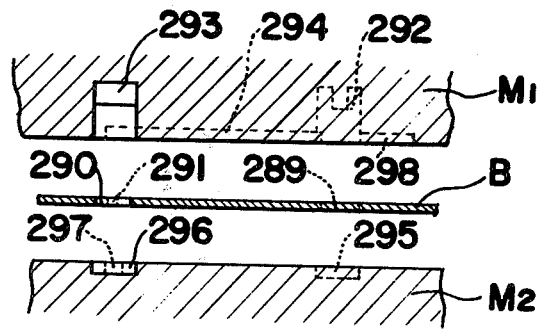
FIG. 74 is a fragmentary side sectional view showing the relation between the base plate and the upper and lower molding blocks for forming the boss projection together with the L-shaped runner shown in FIGS. 70 and 72.

Referring to FIGS. 71 and 75, there is shown two boss projections 280 and 281 being connected by an L-shaped runner 282. It is necessary to form such L-shaped runner between the boss projections 280 and 281 when the space between the boss projection must be left open for installing one of the components 283 thereat. The boss projection 280 has exactly the same configuration as the boss projection described in Item 8. On the other hand, the boss projection 281 has a plate-like projection 284 formed on the top portion thereof, instead of the cylindrical recess. Each of the boss projections 280 and 281 are fixedly mounted on the base plate B by masses 285 and 286 formed immediately below the base plate B at positions opposite the boss projections 280 and 281, respectively. The L-shaped runner 282 has the corner portion 287 fixedly mounted on the base plate B by a mass 288 formed immediately below the base plate B at a position opposite the corner portion 287.

In order to form such boss projections on the base plate B with the L-shaped runner 282 connecting these two boss projections 280 and 281, the base plate B first has three openings 289, 290 and 291 formed therein. The larger openings 289 and 290 are provided for integrally connecting the boss projections 280 and 281 with the masses 285 and 286, respectively, while the smaller opening 291 is provided for integrally connecting the corner portion 287 of the runner 282 with the mass 288. Then, the base plate B is sandwiched between the upper and lower molding blocks $M_1$ and $M_2$. The upper molding block $M_1$ has two recesses 292 and 293, which correspond with the configuration of the boss projections 280 and 281, respectively, and also an L-shaped groove 294 for connecting the two recesses 292 and 293. On the other hand, the lower molding block $M_2$ has three shallow recesses 295, 296 and 297 for molding the masses 285, 286 and 288, respectively.

It should be noted that the upper molding block $M_1$ is further provided with a groove 298 extending from the recesses 292 towards one of the neighboring recess (not shown) for receiving the molten synthetic resin therefrom into the recess 292 and further to the recess 293.

After effecting the molding process in the same manner as described above, the ejected runner 282 may shrink to some degree during cooling.

Referring to FIG. 75, if the runner 282 were not provided with the mass 288 which fixedly supports the corner portion 287 thereof on the base plate B, the force in the runner 282 due to shrinking will not only affect the L-shaped runner 282' to stretch it, but will also affect the boss projection 281 to twist in the clockwise direction, as shown in dotted lines in FIG. 75. However, the L-shaped runner 282 of the present invention is fixedly mounted on the base plate at the corner portion 287, so that the shrinking of the runner 282 occurs within the straight sections of the L-shaped runner 282. In other words, the effect of the shrinking force in one of the straight sections of the L-shaped runner is absorbed within that are straight section, while the effect of the shrinking force in the other straight section is absorbed within that other straight section. Therefore, the force due to the shrinking of the runner 282 acts on each of the boss projections only in the radial direction thereof, thus producing no twisting force on the boss projection 281, resulting in precise positioning of the boss projections 281.

It should be noted that the runner 282 described as being formed in the shape of an L can be formed in any zigzag form in relation to the configuration of the component to be placed between the boss projections 280 and 281. In this case, the mass may be formed at the corner portion nearest to the boss projection.

It should also be noted that the runner 282 described as being formed on the upper surface of the base plate B can be formed on lower surface of the base plate B.

Since the L-shaped runner 282 is fixedly mounted on the base plate at corner portion 287, the shrinking force of the L-shaped runner is intercepted at corner portion 287 thereof, thus preventing any adverse effect of the shrinking force. Therefore, the boss projections do not receive any twisting force from the L-shaped runner 282.

ITEM 13

Referring to FIGS. 76 to 80, there is shown two boss projections 300 and 301 connected by a runner 302. Each of the two boss projections 300 and 301 is fixedly mounted on the base plate B by masses 303 and 304 formed immediately below the base plate B at positions opposite the boss projections 300 and 301, respectively.

Figure 77:
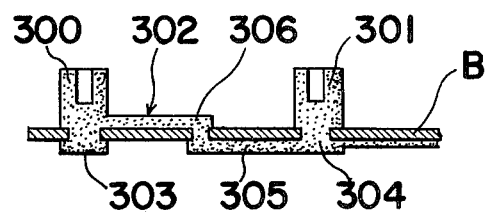
FIG. 77 is a fragmentary side sectional view of a runner showing details of the construction thereof.
Figure 78:
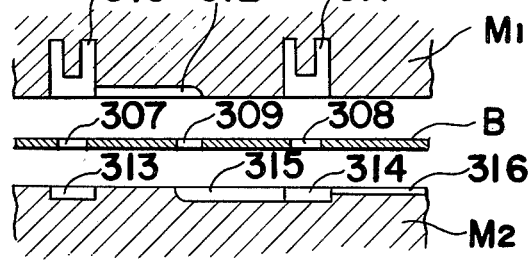
FIG. 78 is a fragmentary side sectional view showing the relation between the base plate and the upper and lower molding blocks for forming the boss projection together with the runner shown in FIG. 76.

The runner 302, extending between the two boss projections 300 and 301 has two sections. The section 305 is formed immediately below the base plate B and extends from the mass 304 toward the other mass 303, but only for little more than a half the distance between the two masses 303 and 304. In a similar manner the section 306 is formed on the upper surface of the base plate B and extends from the base portion of the boss projection 300 toward the base portion of the other boss projection 301, but only for a little more than half the distance between the two boss projections 300 and 301, so that midway between these two boss projections 300 and 301, the end portion of the section 305 overlaps the end portion of the section 306 with base plate B between these two sections 305 and 306. At said midway portion, these two sections 305 and 306 are integrally connected to each other, as best shown in FIG. 77.

In order to form the two boss projections 300 and 301 connected with such a runner 302, the base plate B first has three openings 307, 308 and 309 formed therein, as shown in FIG. 79. The larger openings 307 and 308 are provided for integrally connecting the boss projections 300 and 301 with the masses 303 and 304, respectively, while the smaller opening 309 is provided for integrally connecting the section 306 of runner 302 the section 305. Then the base plate B is sandwiched between the upper and lower molding blocks $M_1$ and $M_2$. The upper molding block $M_1$ has two recesses 310 and 311 for molding the boss projections 300 and 301, and also a groove 312 extending from the recess 310 toward the other recess 311, but only for a little more than half the distance between the two recesses 310 and 311. On the other hand, the lower molding block $M_2$ has two shallow recesses 313 and 314 for molding the masses 303 and 304, and also a groove 315 extending from the shallow recess 314 towards the other shallow recess 313, but only for a little more than half the distance between the two recesses 313 and 314.

It should be noted that the shallow recess 314 is further connected with another groove 316 for receiving the molten synthetic resin therethrough into the recesses 311 and 310.

After effecting the molding process in the same manner as described above, the ejected runner 302 may shrink to some degree, mostly in the longitudinal direction thereof, during cooling. Since the runner 303 connecting the two boss projections 300 and 301 is divided into two sections 305 and 306, the amount of shrinkage produced in each section is not as large as the amount of shrinkage in a runner which directly connects two boss projections.

Figure 80:
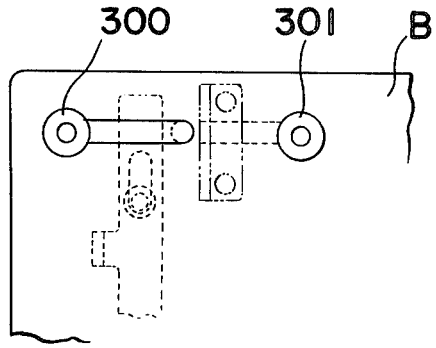
FIG. 80 is a fragmentary top plan view of the base plate with the boss projection and runner shown in FIG. 76, and also provided with the composing elements for the framework.
Figure 81:
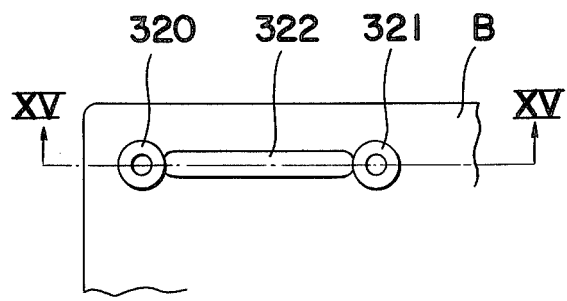
FIG. 81 is a fragmentary top plan view of a runner connecting the two boss projections.

Furthermore, since the runner extends only for approximately half the distance between the boss projections, it is possible to provide some component or components directly on the base plate in the rest of the open space between the two boss projections 300 and 301, as shown in chainlies in FIG. 80.

It should be noted that the runner 302 described as being formed in two separate sections 305 and 306 can be formed by more than two sections alternately above and below the base plate B over the distance between the two boss projections, or in relation to the positioning of the component to be installed on the base plate.

Since the runner 302 is divided into two sections, the force due to the shrinking of the runner 302 is reduced to half when compared with a runner such as shown in FIG. 57, resulting in less force affecting boss projections. Furthermore, since the runner 302 only covers half the distance between the boss projections, it is possible to install some components on the other half.

ITEM 14

Figure 82:
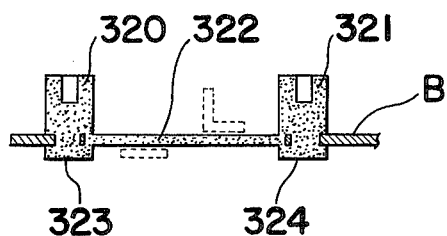
FIG. 82 is a cross-sectional view taken along the line XV—XV in FIG. 81.

Referring to FIGS. 81 to 84, there is shown two boss projections 320 and 321 connected by a runner 322. Each of the two boss projections 320 and 321 is fixedly mounted on the base plate B by masses 323 and 325 formed immediately below the boss projections 320 and 321, respectively. The runner 322 extending between the two boss projections 320 and 321 is completely buried in the base plate B, as best shown in FIG. 82.

Figure 83:
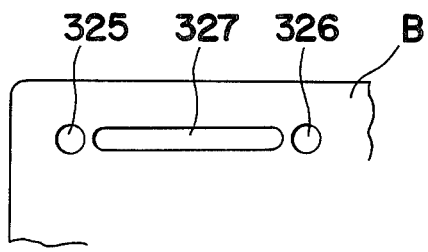
FIG. 83 is a fragmentary top plan view of the base plate showing openings for forming the boss projections together with the runner shown in FIG. 81.
Figure 84:
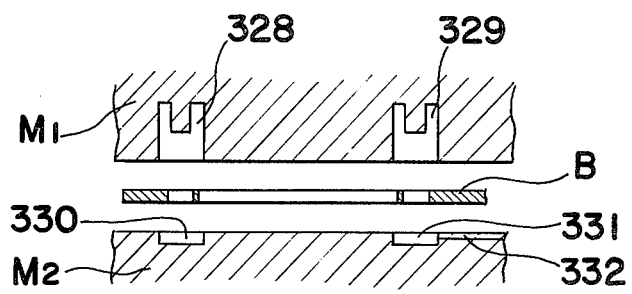
FIG. 84 is a fragmentary side sectional view showing the relation between the base plate and the upper and lower molding blocks for forming the boss projections and the runner shown in FIG. 81.

In order to form the two boss projections 320 and 321 connected with such a runner 322, the base plate B first has three openings 325, 326 and 327, formed therein as best shown in FIG. 83.

The openings 325 and 326 are provided for integrally connecting the boss projections 320 and 321 with the masses 323 and 324, respectively, while the elongated opening 327 formed in the space between the openings 325 and 326 is provided for forming the runner 322 therein. Then the base plate B is sandwiched between the upper and lower molding blocks $M_1$ and $M_2$. The upper molding block $M_1$ has two recesses 328 and 329, while the lower molding block $M_2$ has two shallow recesses 330 and 331.

It should be noted that the size of the opening of the recess 328 formed in the upper molding block $M_1$ and the size of the shallow recess 330 formed in the lower molding block are sufficiently large to cover, when a base plate B is sandwiched therebetween, not only the opening 325 formed in the base plate B, but also a part of the elongated opening 327. In a similar manner, the opening of the other recess 329 formed in the upper molding block $M_1$ and that of the shallow recess 331 formed in the lower molding block $M_2$ also covers a part of the elongated opening 327, together with the opening 326 formed in the base plate B so that the cavity for the boss projections 320 and 321 can be connected with the elongated opening when the upper and lower molding blocks $M_1$ and $M_2$ sandwich the base plate B.

It should also be noted that the shallow recess 331 connected with a groove 332 for receiving the molten synthetic resin therethrough into the cavity.

After carrying out the molding process in the same manner as described above, the ejected runner 322 may shrink to some degree, mostly in the longitudinal direction thereof, during cooling. Since the runner 322, connecting the two boss projections 320 and 321 is completely buried in the elongated opening 327, the force due to the shrinking of the runner can be absorbed in the elongated opening 327, thus exerting no serious force on the boss projections 320 and 321 to deform the configurations thereof. Furthermore, since the runner 322 is not projecting from the surfaces of the base plate B, it is possible to provide a component or components in the space between the two boss projections 320 and 321.

It should be noted that the runner 322 described as being molded in the elongated opening 327 can be molded in an elongated groove formed in at least on one side of the base plate B.

Figure 85:
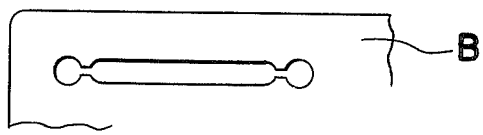
FIG. 85 is a similar view to FIG. 83, but particularly shows a modification thereof.

It should also be noted that the elongated opening described as formed in the space between the two openings 325 and 326 can be connected with the openings 325 and 326 at the opposite ends thereof, as shown in FIG. 85, and also can be provided with of branches to form more runners for connecting more than two projections.

Since the runner 322 connecting the two boss projections is mounted in the opening 327, the effect of the shrinking force due to shrinking of the runner 322 is limited to the opening 327, thus preventing said shrinking force from affecting the boss projections. Furthermore, since the runner 322 does not project from the surface of the base plate B, it is possible to lay some components across the runner 322 without difficulty.

It should be noted that the base plate described as being a metallic plate can be replaced by any other type of plate as long as the plate does not deform at the melting temperature of the synthetic resin.

It should also be noted that the various runners described as employed for connecting boss projections are not necessarily used for connecting the boss projections, but may be used for connecting any other types of the synthetic resin projections.

It should also be noted that the boss projections or any other projections described as fixedly mounted on the upper surface of the base plate, can be formed on the lower surface of the base plate, when necessary by providing a suitable recess in the lower molding block.

As described in detail hereinabove, the synthetic resin projections to be mounted on the base plate to construct the framework, can all be formed at once by the process of molding, and yet the positioning of each of the projections can be effected with accuracy.

Although the present invention has been fully described by way of examples with reference to the attached drawings, it is to be noted that various changes and modifications will be apparent to those skilled in the art. Therefore, unless otherwise, such changes and modifications depart from the scope of the present invention, they should be construed as being included therein.

I claim:

1. A method of manufacturing a hybrid framework assembly for use in electrical or mechanical devices as a substratum for supporting and actuating various components incorporated in said devices, said hybrid framework assembly including a base plate having therein at least one first opening, and at least one projection mounted on said base plate and made of synthetic resin and having the base thereof attached to one surface of said base plate and having a cross-section larger than said first opening and projecting from said one surface of said base plate over said first opening, said projection having a constricted portion which is integral with said projection and extending from said base through said first opening, and a mass of synthetic resin integral with the end of the constricted portion and tightly engaged with the surface of said base plate and at least partially covering said first opening for tightly holding said projection on said base plate, said manufacturing method comprising the steps of:
  (a) forming said first opening in said base plate;
  (b) forming in said base plate a second opening adjacent said first opening;
  (c) placing against said one surface of said base a first molding block having a plane surface and at least one first recess formed in said plane surface, said first recess having a configuration for molding said projection and having an aperture opening out of said first recess through said plane surface which has a cross-sectional area larger than that of said first opening in said base plate, said first molding block being placed at a position to cover said first opening with said aperture of said first recess;
  (d) at least a portion of said first recess a being aligned with said second opening;
  (e) placing against the other surface of said base a second molding block having a plane surface with at least one second recess formed in said plane surface, said second recess having a configuration for molding said mass and having an aperture opening out of said second recess through said plane surface which has a cross-sectional area at least partially covering said first opening in said base plate and overlapping the edge of said base plate around at least part of said first opening, thereby forming a cavity by said first and second recesses extending through said first opening in said metallic base plate;
  (f) providing said second molding block with a molding projection which extends through said second opening and is aligned with and extends into said first recess when said molding blocks are against said base plate, said molding projection having a cross-sectional shape for leaving a space between said molding projection and the edge of said second opening around the periphery of said opening;
  (g) injecting molten synthetic resin from a cavity gate in at least one of said molding blocks into said first and second recesses and also in said openings in said base plate for entirely filling the cavity with said molten synthetic resin for forming said projection and integrally forming within said second opening, adjacent to said projection, a frame member of synthetic resin having a hole therein; and
  (h) removing said first and second molding blocks from said base plate, leaving said projection firmly fixed on said base plate.

* * * * *